(12) United States Patent
Chen et al.

(10) Patent No.: US 11,355,312 B2
(45) Date of Patent: Jun. 7, 2022

(54) STAGE DRIVING SYSTEM AND APPARATUS OR DEVICE SUCH AS APPARATUS OF CHARGED-PARTICLE BEAM COMPRISING THE SAME

(71) Applicants: Zhongwei Chen, Los Altos Hills, CA (US); Xiaoming Chen, Sunnyvale, CA (US); Daniel Tang, Fremont, CA (US); Liang-Fu Fan, Fremont, CA (US)

(72) Inventors: Zhongwei Chen, Los Altos Hills, CA (US); Xiaoming Chen, Sunnyvale, CA (US); Daniel Tang, Fremont, CA (US); Liang-Fu Fan, Fremont, CA (US)

(73) Assignee: BORRIES PTE. LTD., Singapore (SG)

( * ) Notice: Subject to any disclaimer, the term of this patent is extended or adjusted under 35 U.S.C. 154(b) by 0 days.

(21) Appl. No.: 17/444,192

(22) Filed: Aug. 1, 2021

(65) Prior Publication Data
US 2022/0108869 A1  Apr. 7, 2022

Related U.S. Application Data

(60) Provisional application No. 63/087,238, filed on Oct. 4, 2020.

(51) Int. Cl.
*H01J 37/28*   (2006.01)
*H01J 37/20*   (2006.01)
(Continued)

(52) U.S. Cl.
CPC ............ *H01J 37/28* (2013.01); *H01J 37/141* (2013.01); *H01J 37/20* (2013.01); *H01J 37/3174* (2013.01); *H01J 2237/0216* (2013.01); *H01J 2237/0453* (2013.01); *H01J 2237/2007* (2013.01); *H01J 2237/20264* (2013.01); *H01J 2237/20278* (2013.01)

(58) Field of Classification Search
CPC ........ H01J 37/28; H01J 37/20; H01J 37/3174; H01J 37/141; H01J 2237/20278; H01J 2237/0216; H01J 2237/20264; H01J 2237/0453; H01J 2237/2007
See application file for complete search history.

(56) References Cited

U.S. PATENT DOCUMENTS 5,051,594 A * 9/1991 Tsuda ............... G01B 7/003
                                              250/442.11
6,346,710 B1 * 2/2002 Ue ..................... G12B 5/00
                                              250/311

(Continued)

*Primary Examiner* — David A Vanore
(74) *Attorney, Agent, or Firm* — George Guosheng Wang; United States Research and Patent Firm

(57) ABSTRACT

The present invention provides a driving system comprising two actuators for moving a stage through two elastic connectors; and a general apparatus/device comprising such a driving system, such as a machine tool, an analytical instrument, an optical microscope, and an apparatus of charged-particle beam such as electron microscope and an electron beam lithographical apparatus. When used in an electron microscope, the stage can be used as a specimen stage or a plate having apertures for electron beam to pass through. The novel stage driving system exhibits numerous technical merits such as simpler structure, better manufacturability, improved cost-effectiveness, and higher reliability, among others.

18 Claims, 20 Drawing Sheets

(51) Int. Cl.
*H01J 37/317* (2006.01)
*H01J 37/141* (2006.01)

(56) References Cited

U.S. PATENT DOCUMENTS

| | | | | |
|---|---|---|---|---|
| 6,721,034 | B1* | 4/2004 | Horikawa | G03F 7/70358 |
| | | | | 355/53 |
| 10,665,487 | B2* | 5/2020 | Kobata | H01L 21/6838 |
| 2002/0017615 | A1* | 2/2002 | Ando | B82Y 35/00 |
| | | | | 250/491.1 |
| 2002/0054280 | A1* | 5/2002 | Tokuda | F16F 15/02 |
| | | | | 355/53 |
| 2002/0185983 | A1* | 12/2002 | Poon | G03F 7/70716 |
| | | | | 318/10 |
| 2005/0205809 | A1* | 9/2005 | Uchida | H01J 37/023 |
| | | | | 250/492.22 |
| 2007/0060433 | A1* | 3/2007 | Schuler | F16H 15/46 |
| | | | | 475/10 |
| 2007/0211235 | A1* | 9/2007 | Shibazaki | G03F 7/70725 |
| | | | | 355/53 |
| 2009/0224718 | A1* | 9/2009 | Honjo | H02N 2/062 |
| | | | | 318/672 |
| 2009/0323083 | A1* | 12/2009 | Park | G01B 11/024 |
| | | | | 356/614 |
| 2020/0156929 | A1* | 5/2020 | Paci | B81B 3/0024 |

* cited by examiner

STAGE DRIVING SYSTEM AND APPARATUS OR DEVICE SUCH AS APPARATUS OF CHARGED-PARTICLE BEAM COMPRISING THE SAME

CROSS-REFERENCE TO RELATED U.S. APPLICATIONS

This application expressly claims the benefit under 35 U.S.C. Section 119(e) and Article 4 of the Stockholm Act of the Paris Convention for the Protection of Industrial Property of U.S. Provisional Patent Application No. 63/087,238, filed Oct. 4, 2020, entitled "Several Designs for Apparatus of Charged-Particle Beam and Methods Thereof," the entire disclosure of which is hereby incorporated by reference.

FIELD OF THE INVENTION

The present invention generally relates to a novel driving system that drives a stage and apparatus or device such as an apparatus of charged-particle beam (e.g. an electron microscope) comprising the driving system. Although the invention will be illustrated, explained, and exemplified by a scanning transmission electron microscope (STEM), it should be appreciated that the present invention can also be applied to other apparatuses or devices such as a machine tool, an analytical instrument, an optical microscope, and other apparatuses of charged-particle beam such as a scanning electron microscope (SEM), transmission electron microscope (TEM), and an electron beam lithographical apparatus.

BACKGROUND OF THE INVENTION

X-Y stages, also known as X-Y tables, cross working tables or coordinate tables, can provide horizontal motion for various apparatuses such as automated machinery and apparatuses of charged-particle beam. X-Y stages are motorized linear slides with linear motion based in bearings which are driven by a drive mechanism, typically a linear motor. X-Y stages are built and configured to provide high-performance positioning along multiple axis. For example, X-Y stages are widely used electron microscopes. Owing to the small de Broglie wavelength of electrons, TEM and STEM can enable the user to examine fine detail as small as a single column of atoms. Therefore, electron microscopes find application in cancer research, virology, materials science as well as pollution, nanotechnology, and semiconductor research, and they are used to investigate the ultrastructure of a wide range of specimens including tumor cells, microorganisms, large molecules, biopsy samples, semiconductor device, metals, and crystals.

U.S. Pat. No. 7,791,043 assigned to Hitachi High-Technologies Corporation discloses a stage system. The system includes a specimen stage, a specimen table, a base member on which the table is mounted, and a pair of drive units for driving the stage. The table is pinched between the pair of the drive units. The drive unit has an ultrasonic motor for driving the table, a pre-load mechanism for pressing the ultrasonic motor against the table, and a piezoelectric actuator for fixing the table. The piezoelectric actuator is mounted on the pre-load mechanism so as to be movable integrally with the ultrasonic motor. The pre-load mechanism has a positioning member fixed on the base member, a seat member to which the ultrasonic motor and the fixing means are attached, and an elastic member for elastically supporting the seat member on the positioning member. The piezoelectric actuator fixes the table by pressing the table and separates the ultrasonic motor from the table. When the stage is fixed by the piezoelectric actuator after acceleration, deceleration and positioning of the stage performed by the drive mechanism, the piezoelectric actuators positioned on opposite sides of the stage are extended to press the stage.

U.S. Pat. No. 8,581,207 assigned to Korea Basic Science Institute teaches a specimen holder capable of a 3-axis movement for transmission electron microscope (TEM) 3D analysis. The holder rotates cradles for supporting the specimen and moves the cradles back and forth and left and right, and freely changes directions of the specimen. A specimen is mounted in a holder head, and a control part moves the mounted specimen. In the holder head, upper and lower cradles are installed to support the specimen. A rotation gear is installed between the upper and lower cradles to rotate the cradles. A rotation driving gear is welded to the rotation gear to rotate it. A gear cover is movably installed horizontally on the upper portion of the upper cradle. A rack moving gear is welded to a rack gear installed in the gear cover to drive the rack gear, thereby allowing the gear cover to move in perpendicular to a length direction of the head body. In the control part, a cradle rotation means rotates the rotation driving gear. The upper and lower cradles are horizontally moved left and right with an axis gear and an associated driving motor and moved back and forth with a rack and an associated driving motor, or a piezo actuator.

However, these stage driving systems in the prior art are complicated and expensive to manufacture, and they are not very reliable either. Advantageously, the present invention provides a novel stage driving system that exhibits numerous technical merits such as simpler structure, better manufacturability, improved cost-effectiveness, and higher reliability, among others.

SUMMARY OF THE INVENTION

One aspect of the invention provides a driving system comprising a first actuator configured to move a first shaft; a second actuator configured to move a second shaft; a stage; a first elastic connector connecting the first shaft and the stage; and a second elastic connector connecting the second shaft and the stage. In preferred embodiments, the stage is moved around on a plane such as a horizontal plane by combined elastic forces from the two elastic connectors deformed by the one or two actuators.

Another aspect of the invention provides a variety of apparatuses and devices using the above driving system. In exemplified embodiments, an apparatus of charged-particle beam such as an electron microscope comprises an objective lens, a specimen table, and a specimen stage having an empty space as a receptacle for accommodating the specimen table. The objective lens has a horizontal planar surface for the specimen table to sit on and slide on. The specimen table can be placed in and removed away from the receptacle. The specimen stage may include one elastic protrusion and one or more elastic force receiving parts (for example, three permanent protrusions) surrounding the empty space. Any three protrusions of said four protrusions are not arranged in a straight line, i.e. they are not arranged in a linear relationship. After the specimen table is placed in the receptacle, the elastic protrusion can push or press the specimen table against the one or more elastic force receiving parts such as all the three permanent protrusions, so as to fix the orientation and the position of the specimen table relative to the specimen stage. The specimen stage can function as an X-Y stage, and it moves the specimen table by sliding it to a plurality of predetermined positions on the planar surface of the objective lens. Then the specimen stage can hold the specimen table on each of the predetermined positions for a period of examination time. During such a period of examination time, if a disturbing vibration between the objective lens and the specimen stage occurs, at least some of the four protrusions will absorb the vibration to an effect that the specimen table remains stationary relative to the objective lens.

The above features and advantages and other features and advantages of the present invention are readily apparent from the following detailed description of the best modes for carrying out the invention when taken in connection with the accompanying drawings.

BRIEF DESCRIPTION OF THE SEVERAL VIEWS OF THE DRAWINGS

The present invention is illustrated by way of example, and not by way of limitation, in the figures of the accompanying drawings and in which like reference numerals refer to similar elements. All the figures are schematic and generally only show parts which are necessary in order to elucidate the invention. For simplicity and clarity of illustration, elements shown in the figures and discussed below have not necessarily been drawn to scale. Well-known structures and devices are shown in simplified form in order to avoid unnecessarily obscuring the present invention. Other parts may be omitted or merely suggested.

DETAILED DESCRIPTION OF THE PREFERRED EMBODIMENT

In the following description, for the purposes of explanation, numerous specific details are set forth in order to provide a thorough understanding of the present invention. It is apparent, however, to one skilled in the art that the present invention may be practiced without these specific details or with an equivalent arrangement.

Where a numerical range is disclosed herein, unless otherwise specified, such range is continuous, inclusive of both the minimum and maximum values of the range as well as every value between such minimum and maximum values. Still further, where a range refers to integers, only the integers from the minimum value to and including the maximum value of such range are included. In addition, where multiple ranges are provided to describe a feature or characteristic, such ranges can be combined.

It is also to be understood that the terminology used herein is for the purpose of describing particular embodiments only and is not intended to limit the scope of the invention. For example, when an element is referred to as being "on", "connected to", or "coupled to" another element, it can be directly on, connected or coupled to the other element or intervening elements may be present. In contrast, when an element is referred to as being "directly on", "directly connected to", or "directly coupled to" another element, there are no intervening elements present.

Throughout the specification and claims, the following terms take the meanings explicitly associated herein, unless the context clearly dictates otherwise. The phrase "in one embodiment" does not necessarily refer to the same embodiment, although it may. Furthermore, the phrase "in another embodiment" does not necessarily refer to a different embodiment, although it may. Thus, as described below, various embodiments of the invention may be readily combined without departing from the scope or spirit of the invention.

In addition, as used herein, the term "or" is an inclusive "or" operator and is equivalent to the term "and/or," unless the context clearly dictates otherwise. The term "based on" is not exclusive and allows for being based on additional factors not described, unless the context clearly dictates otherwise. In addition, throughout the specification, the meaning of "a," "an," and "the" include plural references. The meaning of "in" includes "in" and "on."

Figure 1:
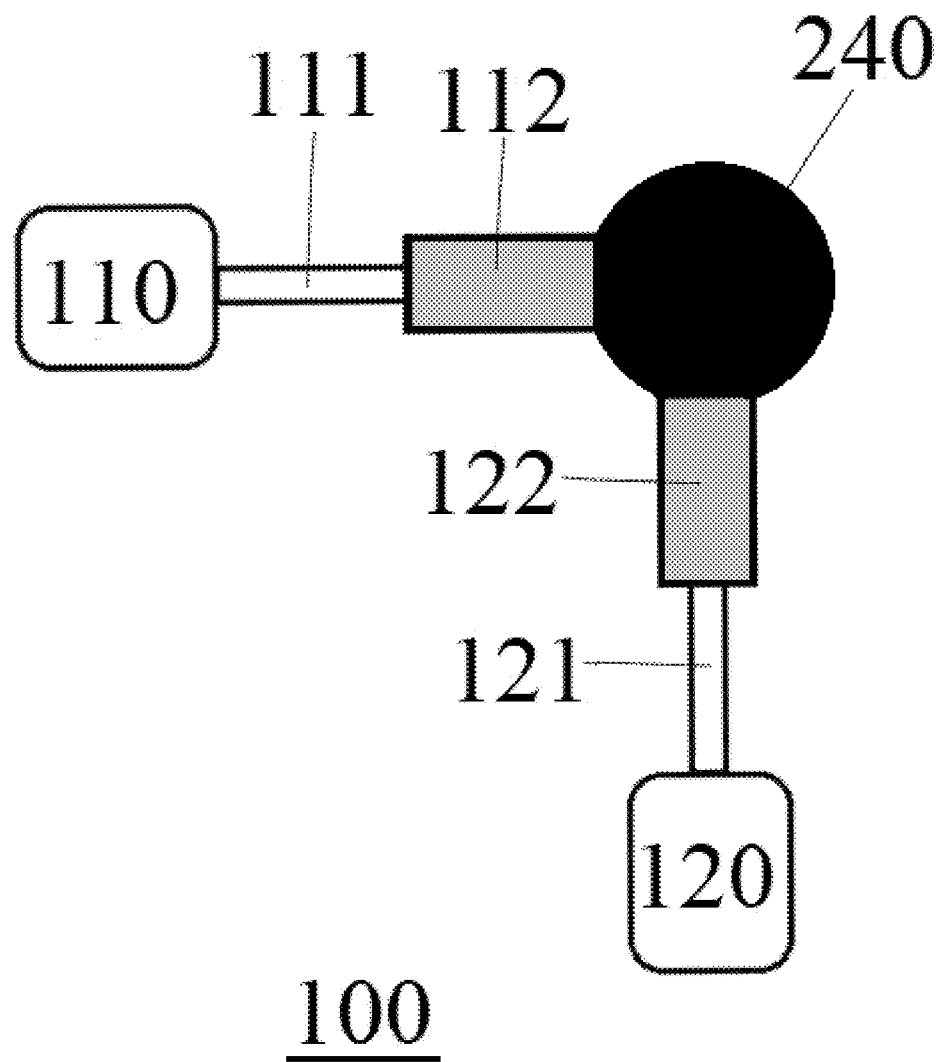
FIG. 1 schematically illustrates a general driving system in accordance with an exemplary embodiment of the present invention.
Figure 2:
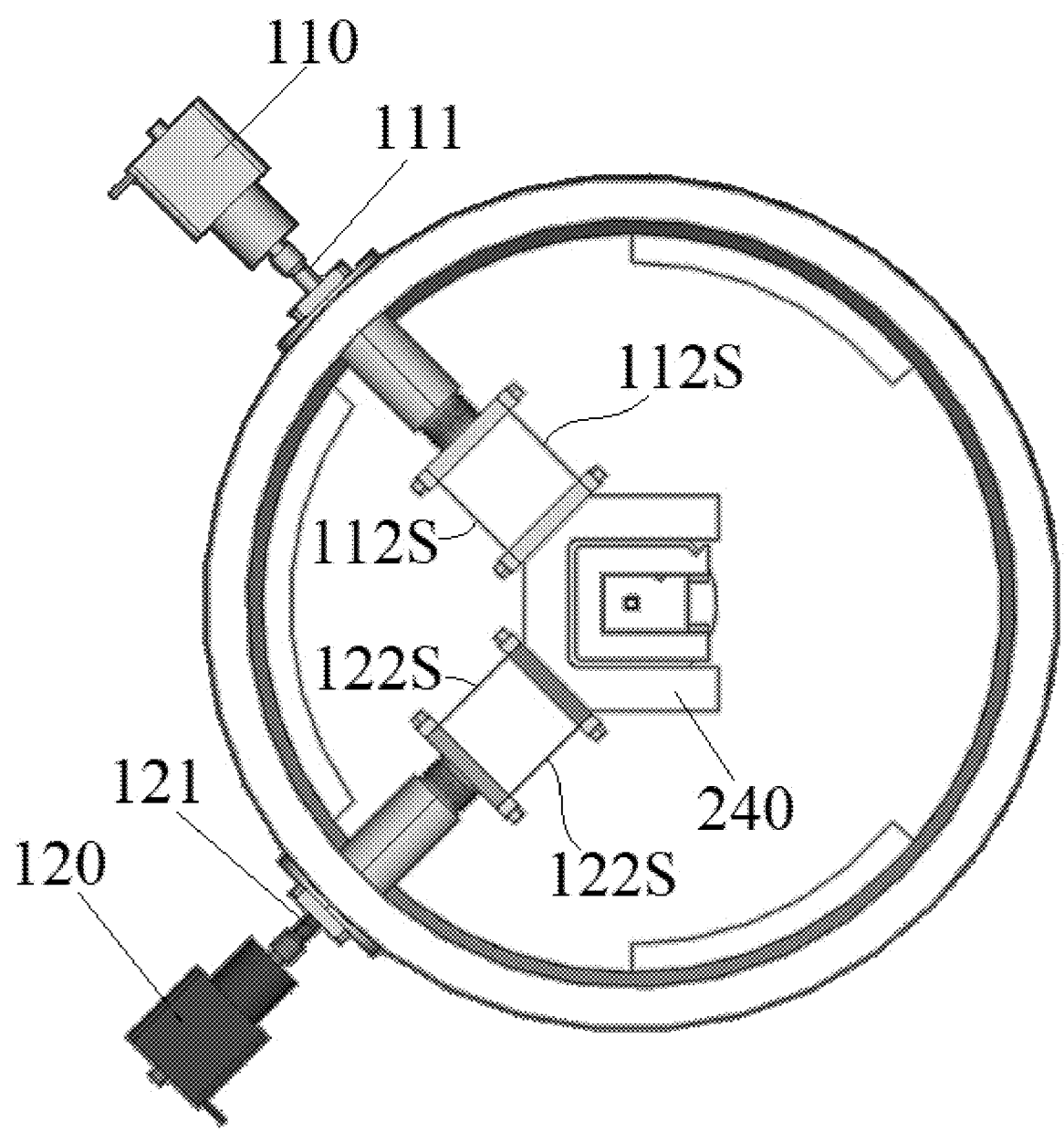
FIG. 2 schematically illustrates a driving system using spring leaves as the elastic connector in accordance with an exemplary embodiment of the present invention.

With reference to FIG. 1, a driving system 100 includes a first actuator 110 configured to move a first shaft 111, a second actuator 120 configured to move a second shaft 121, a stage 240, a first elastic connector 112 connecting the first shaft 111 and the stage 240; and a second elastic connector 122 connecting the second shaft 121 and the stage 240. The driving system 100 may be placed inside a vacuum environment or an atmospheric environment. The first and second actuators (110, 120) may be selected from two motors such as linear motors, step motors, magnetic levitations, planar motors, piezoelectric motors, and pulse motors. The first elastic connector 112 may include a block of elastic material such as polybutadiene, butyl rubber, silicone rubber and the like as shown in FIG. 1, or two or more spring leaves 112S such as copper spring leaves as shown in FIG. 2. Similarly, the second elastic connector 122 may include a block of elastic material such as polybutadiene, butyl rubber, silicone rubber and the like as shown in FIG. 1, or two or more spring leaves 122S such as copper spring leaves as shown in FIG. 2.

In preferred embodiments, the first actuator 110 and the second actuator 120 are identical; the first shaft 111 and the second shaft 121 are identical; and the first elastic connector 112 and the second elastic connector 122 are identical.

As shown in FIGS. 1 and 2, the first actuator 110 is configured to move the first shaft 111 along a longitudinal direction thereof ("the first longitudinal direction"). The second actuator 120 is configured to move the second shaft 121 along a longitudinal direction thereof ("the second longitudinal direction"). The first longitudinal direction and the second longitudinal direction may have an angle of greater than 0° and less than 180° such as 85°-95° or about 90°.

Figure 3:
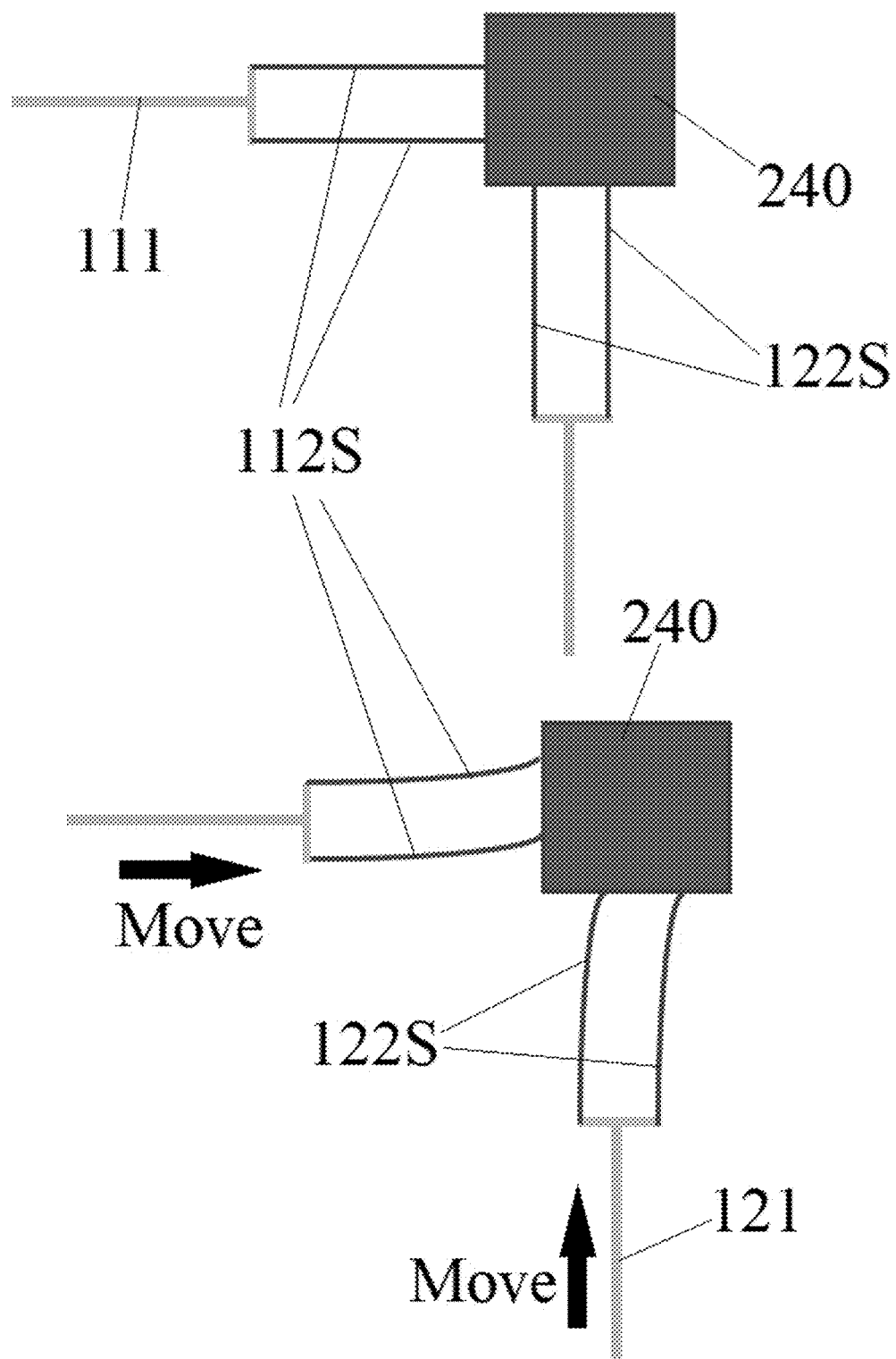
FIG. 3 schematically illustrates a working state of the driving system of FIG. 2 in accordance with an exemplary embodiment of the present invention.

Referring to FIG. 3, the stage 240 may be moved around on a X-Y plane such as a horizontal plane by combined elastic forces from the two elastic connectors (112, 122) that are deformed by the one or two actuators (110 and/or 120). For example, by moving (pushing or pulling) shafts 111 and 121 along the first longitudinal direction and the second longitudinal direction respectively for calculated distances (same or different), a combined elastic forces may be generated from spring leaves 112S and 122S that are bent to the same degree or different degrees. Such a combined elastic forces may position the stage 240 at a desirable location on the X-Y plane.

Figure 4:
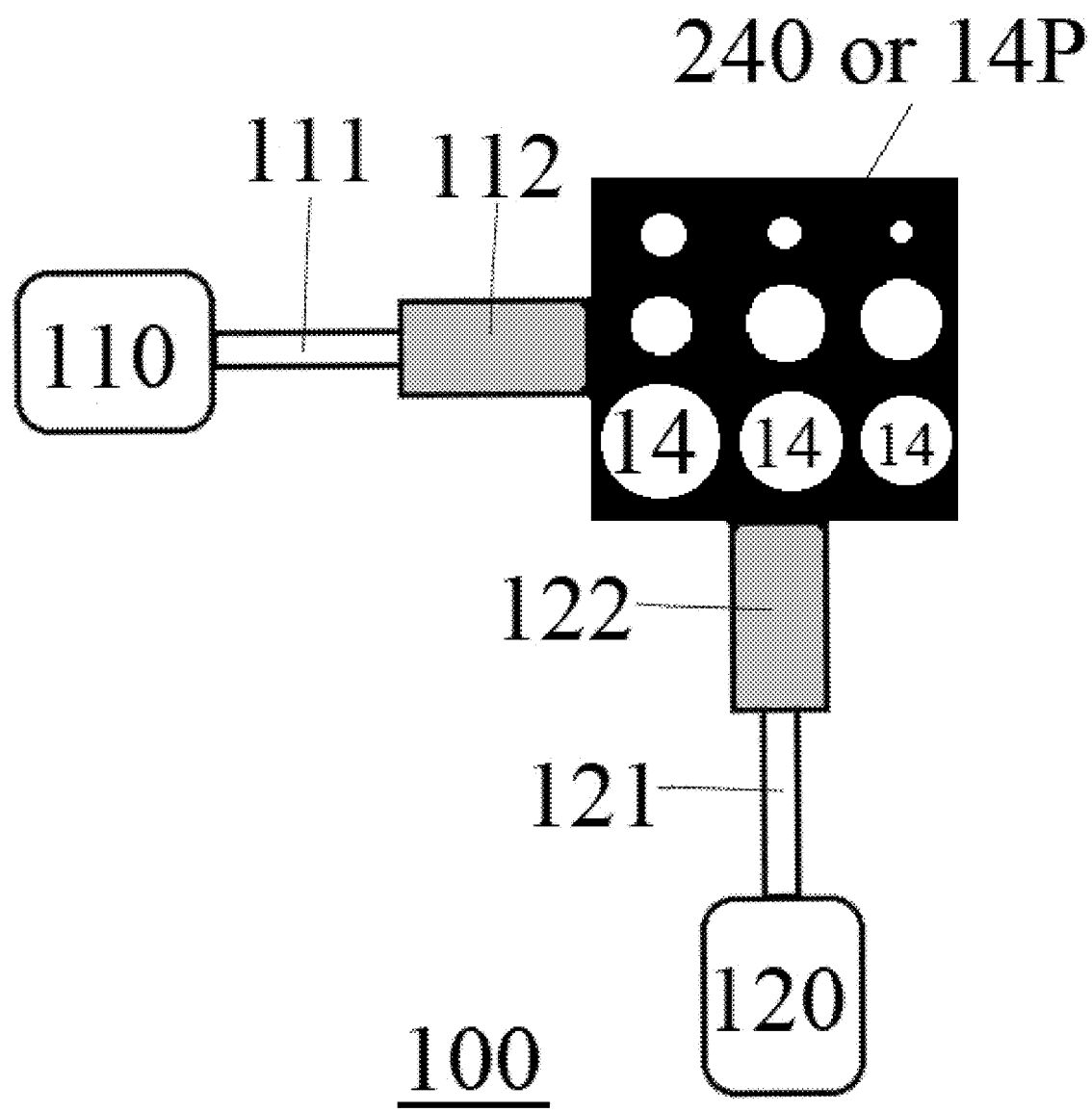
FIG. 4 shows a design of the stage as a plate with two or more apertures in accordance with an exemplary embodiment of the present invention.

In various embodiments, the stage 240 may be configured to carry a control device, a sample (or specimen) or a workpiece. It is also possible that at least a part of the stage itself is a control device, a sample (or specimen) or a workpiece. As shown in FIG. 4, the stage 240 itself may be a control device such as an electron beam control device, which may be e.g. a (metal) plate 14P with two or more apertures 14 of different sizes for electron beam to pass through, such as a matrix of apertures 14.

Figure 5:
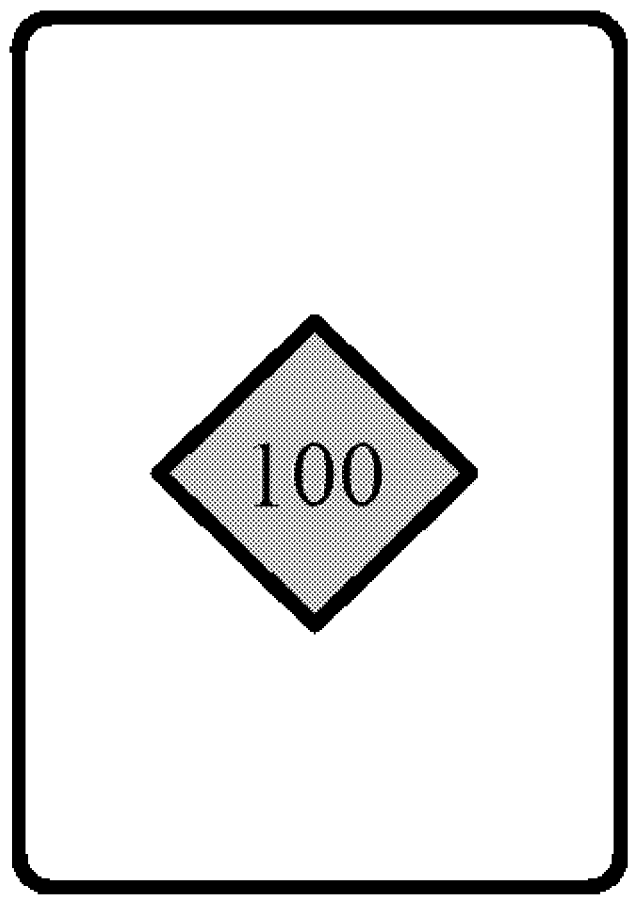
FIG. 5 schematically illustrates a general apparatus/device comprising the driving system of FIG. 1 in accordance with an exemplary embodiment of the present invention.

A further aspect of the invention provides an apparatus/device 130 comprising a driving system 100 as escribed above. As shown in FIG. 5, the apparatus/device 130 may be a machine tool, an analytical instrument, an optical microscope, and an apparatus of charged-particle beam such as electron microscope and an electron beam lithographical apparatus.

Figure 6:
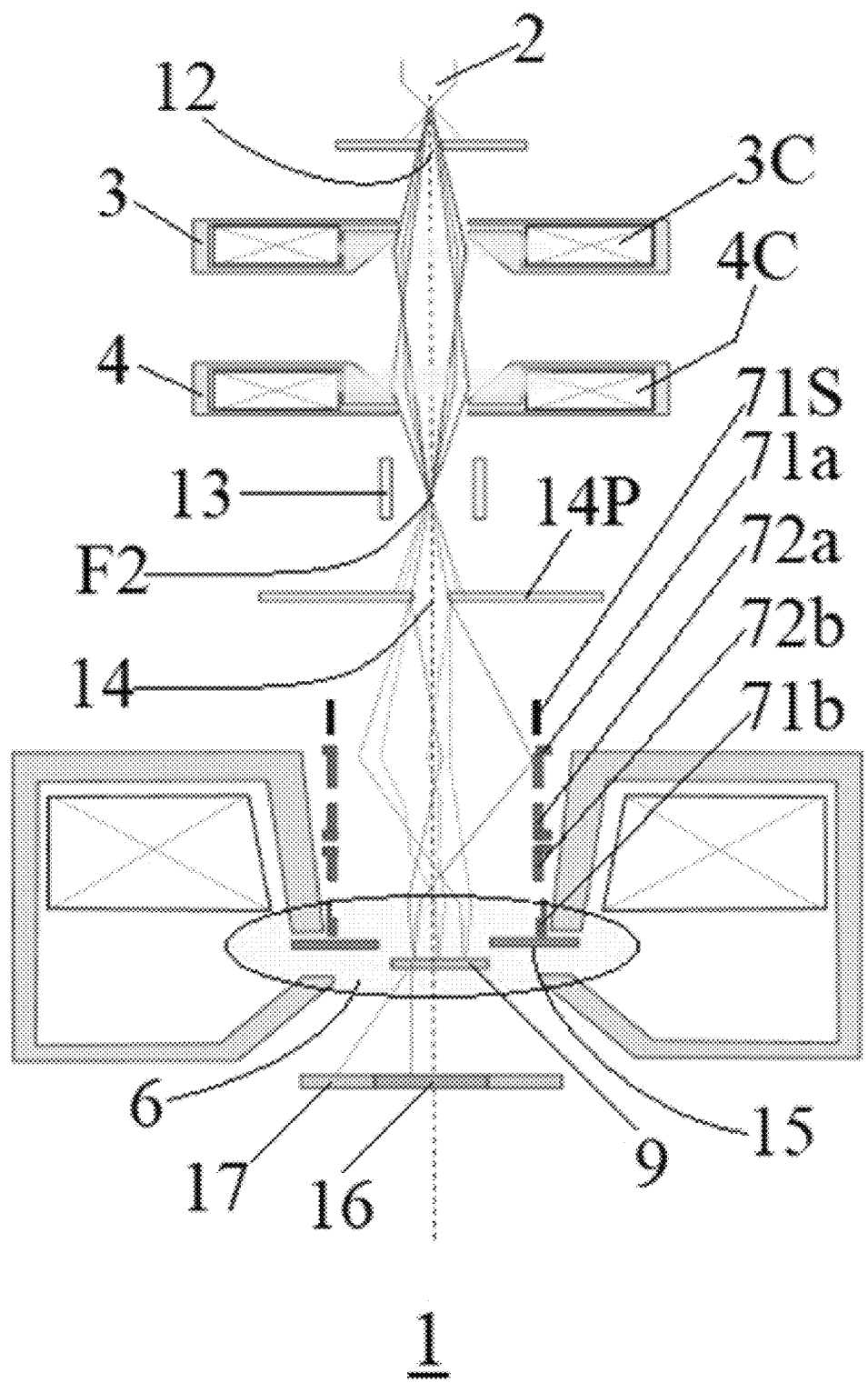
FIG. 6 shows an electron microscope including the plate of FIG. 4 in accordance with an exemplary embodiment of the present invention.

For example, the plate 14P as shown in FIG. 4 may be used in an electron microscope 1 as shown in FIG. 6. For conciseness, components 110-112 and 120-122 in FIG. 4 are not shown (omitted) in FIG. 6. With reference to FIG. 6, the source of charged particles may be an electron gun 2 configured to emit an electron beam through gun aperture 12. Along the beam trajectory, co-condenser 3 with magnetic coil 3C is placed between gun aperture 12 and co-condenser 4 with a magnetic coil 4C. The electron beam is focused to crossover spot F2 before it passes through beam blanking 13. After the beam passes through objective aperture 14 and stigmator 71s, it is deflected by an upper deflector 71a and a lower deflector 71b in a macroscopic deflection sub-system. It can also be deflected by an upper deflector 72a and a lower deflector 72b in a microscopic deflection sub-system. In the meanwhile, the beam is focused by the magnetic objective lens 6 onto a specimen within the specimen holder 9. Electrons scattered from and penetrated through the specimen are detected by the BSE detector 15, BF detector 16 and DF detector 17 for generating specimen images. Deflectors 71a, 72a, 72b and 71b may reside in the central bore the magnetic objective lens 6, and they are disk-shaped rings which are axially symmetric about the Z-axis. Each deflector may have a same or different diameter and may fit at a particular position along the Z-axis. An actual bucket-shaped structure may be used to hold the deflectors, and the structure is inserted into the bucket-shaped space of the lens system thus making assembly easier.

Figure 7:
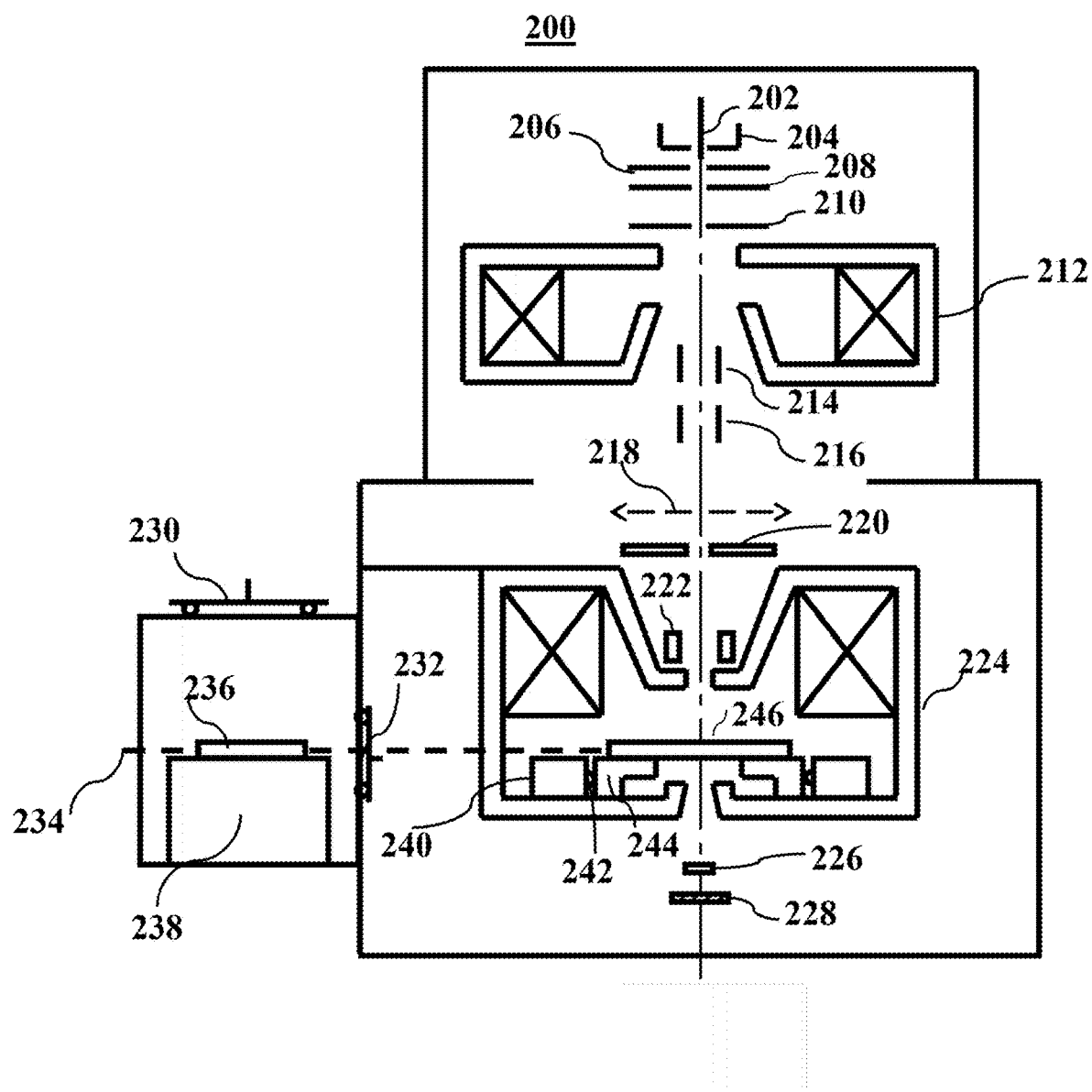
FIG. 7 schematically shows the structure of an apparatus of charged-particle beam such as an electron microscope comprising the general driving system of FIG. 1 in accordance with an exemplary embodiment of the present invention.

In some other embodiments, the stage 240 as shown in FIGS. 2 and 3 may be used in a representative example of an electron microscope as shown in FIG. 7. For conciseness, components 110-112 and 120-122 in FIGS. 2 and 3 are not shown (omitted) in FIGS. 7-20. In an apparatus of charged-particle beam such as an electron microscope, the manipulation of an electron beam is performed using two physical effects. The interaction of electrons with a magnetic field will cause electrons to move according to the left-hand rule, thus allowing for electromagnets to manipulate the electron beam. The use of magnetic fields allows for the formation of a magnetic lens of variable focusing power, and the lens shape is determined by the distribution of magnetic flux. Electrostatic fields can cause the electrons to be deflected through a constant angle. Coupling of two deflections in opposing directions with a small intermediate gap allows for the formation of a shift in the beam path. From these two effects, as well as the use of an electron imaging system, sufficient control over the beam path is made possible. The lenses in the beam path can be enabled, tuned, and disabled entirely and simply via rapid electrical switching, the speed of which is only limited by effects such as the magnetic hysteresis.

For a skilled person in the art, many of the components in FIG. 7 are well-known. For example, electron beam source 202 such as a tungsten filament or a lanthanum hexaboride (LaB$_6$), suppressor electrode 204, beam extractor 206, anode 208, gun aperture 210, condenser lens 212 that is responsible for primary beam formation, beam blanker 214, stigmator 216 for the correction of asymmetrical beam distortions, objective aperture 218, SEM up detector 220, deflector 222, bright field detector 226, dark field detector 228. A system for the insertion into, motion within, and removal of specimens from the beam path is also needed. The system may include load lock 230, chamber interlock 232, lock port 234, loading and unloading mechanism 236, and transfer table 238. Other parts in the microscope may be omitted or merely suggested.

Figure 8:
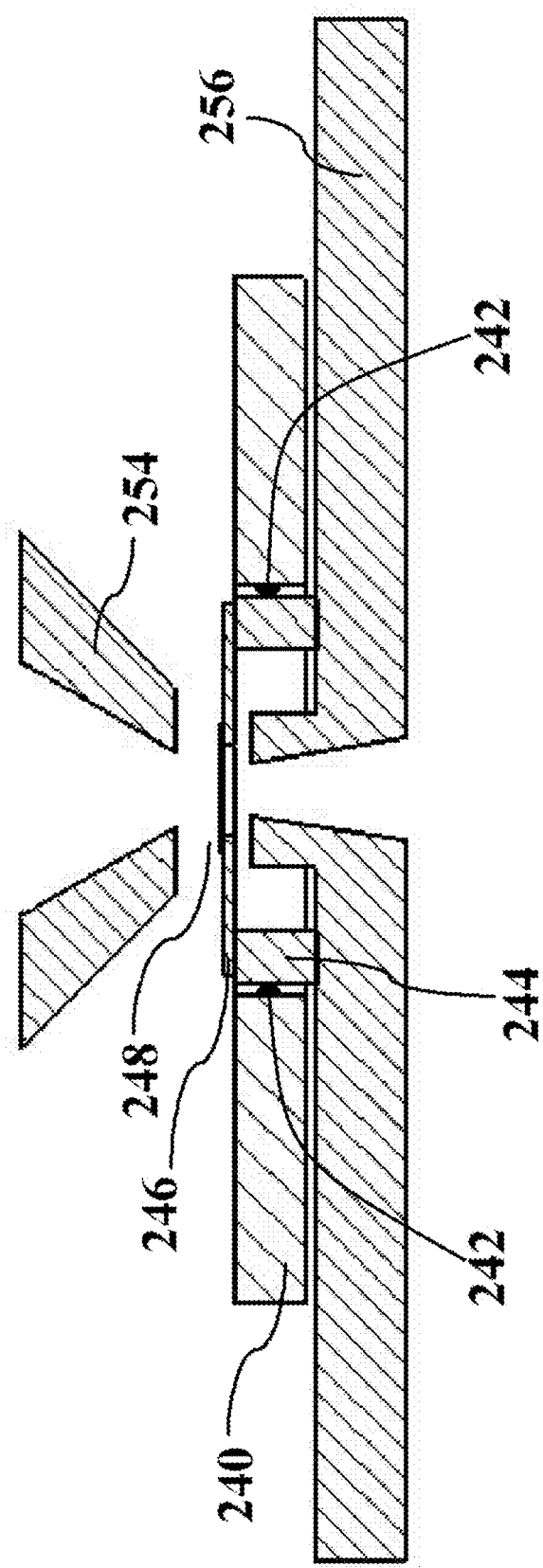
FIG. 8 illustrates the local structure around the specimen table in an electron microscope in accordance with an exemplary embodiment of the present invention.

FIG. 8 only show some parts of FIG. 7 that are necessary in order to elucidate the stage 240 (specimen stage 240) as shown in FIGS. 2-3 and other parts around specimen stage 240. These parts include an objective lens 224, sliding specimen table 244, specimen holder 246, and specimen 248. An elastic protrusion and one or more elastic force receiving parts of the specimen stage 240, such as small convex or protrusions 242, in FIG. 7 are also necessary in order to elucidate the invention.

Although electron lenses may operate electrostatically or magnetically, the majority of electron lenses use electromagnetic coils to generate a convex lens. The field produced for the lens must be radially symmetrical, as deviation from the radial symmetry of the magnetic lens causes aberrations such as astigmatism and worsens spherical and chromatic aberration. A quadrupole lens is an arrangement of electromagnetic coils at the vertices of the square, enabling the generation of a lensing magnetic fields, the hexapole configuration simply enhances the lens symmetry by using six, rather than four coils. Electron lenses may be manufactured from iron, iron-cobalt or nickel cobalt alloys, such as permalloy, due to their good magnetic properties, such as magnetic saturation, hysteresis and permeability. It should be appreciated that the objective lens 224 may be an electromagnetic lens or an electrostatic lens.

Objective lens 224 allows for electron beam convergence, with the angle of convergence as a variable parameter. The magnification may be simply changed by modifying the amount of current that flows through the coil of lenses. Lens 224 may include the yoke, the magnetic coil, the poles, the pole piece, and the external control circuitry. As shown in FIG. 7, electromagnetic lens 224 includes an upper pole piece 254 and a lower pole piece 256. The pole piece must be manufactured in a very symmetrical manner, as this provides the boundary conditions for the magnetic field that forms the lens. Imperfections in the manufacture of the pole piece can induce severe distortions in the magnetic field symmetry, which induce distortions that will ultimately limit the lenses' ability to reproduce the object plane. The exact dimensions of the gap, pole piece internal diameter and taper, as well as the overall design of the lens is often performed by finite element analysis of the magnetic field, considering of the thermal and electrical constraints of the design.

The coils which produce the magnetic field are located within the lens yoke. The coils can contain a variable current, but typically utilize high voltages, and therefore require significant insulation in order to prevent short-circuiting the lens components. Thermal distributors are placed to ensure the extraction of the heat generated by the energy lost to resistance of the coil windings. The windings may be water-cooled, using a chilled water supply in order to facilitate the removal of the high thermal duty.

The specimen stage 240 includes an empty space as a receptacle for accommodating the specimen table 244. There is a horizontal planar surface around lower pole piece 256, and the specimen table 244 can sit on, and slide on, the planar surface. The specimen stage 240 can move the specimen table 244 by sliding it to a plurality of predetermined positions on the horizontal planar surface, and to hold the specimen table 244 on each of the predetermined positions for a period of examination time. When a disturbing vibration between the objective lens 224 and the specimen stage 244 occurs during the period of examination time, the vibration will be absorbed or dampened to an effect that the specimen table 244 remains stationary relative to the objective lens 224 during the period of examination time. In other words, an ensuing vibration of noise level about each of the predetermined positions will not be generated between the objective lens 224 and the specimen table 244 during the period of examination time.

In a typical embodiment, specimen stage 240 can move specimen table 244 by sliding the table on the horizontal planar surface around lower pole piece 256 from one observation point to another one. For example, the sliding distance between two adjacent observation points may be greater than 1 μm, preferably greater than 5 or 10 μm. Once specimen table 244 arrives at the observation point, it will stay stationary on the observation point, until it is moved again by stage 240 to the next observation point. At each observation point, however, the disturbing vibration of the stage 240 cannot transmit to the specimen table. For example, the vibration may have an amplitude of less than 2 nm, such as less than 1 nm.

Figure 9:
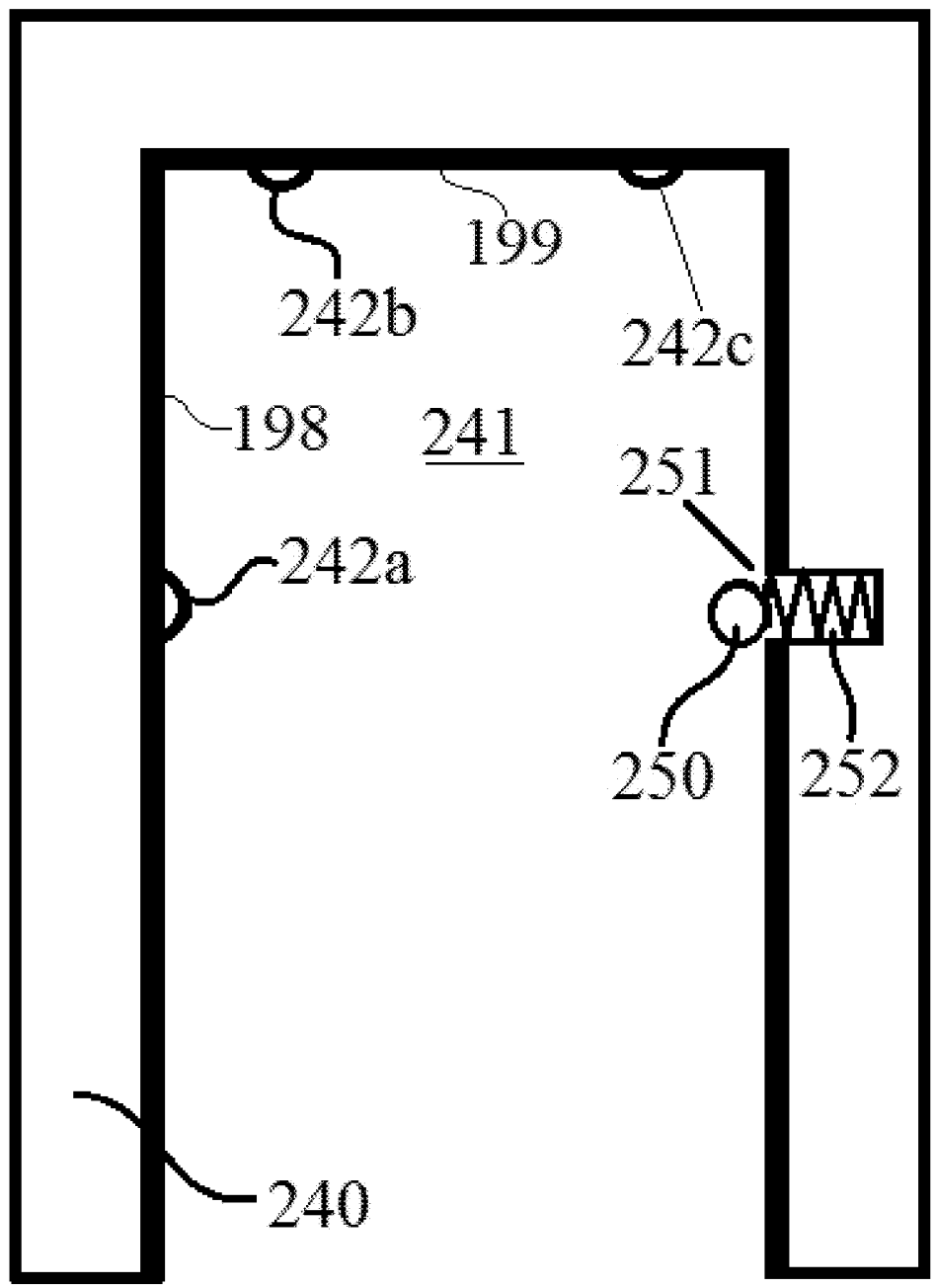
FIG. 9 is the top view of a table receptacle in a specimen stage in accordance with an exemplary embodiment of the present invention.

Referring to FIG. 9, the specimen stage 240 has an empty space as a receptacle 241 for accommodating the specimen table 244. In operation, specimen table 244 can be placed in and removed away from the receptacle 241. The specimen stage 240 may include an elastic protrusion 252 and one or more elastic force receiving parts, for example the side wall 198 opposite to the elastic protrusion 252, the side wall 199 neighboring the elastic protrusion 252, and/or protrusion(s) on the side walls 198 and/or 199, such as three permanent protrusions 242a, 242b and 242c, that are surrounding the empty space of receptacle 241. Permanent protrusions 242a, 242b and 242c may be dome-shaped as shown in FIG. 9 and may be made of a non-magnetic material such as ceramic material, non-ferrous metals such as aluminum, copper, lead, nickel, tin, titanium and zinc, and non-ferrous alloys such as Beryllium Copper (BeCu). An embodiment of elastic protrusion 251 includes a ball 250 attached to a spring 252. Depending on the force against ball 250, the ball can extend more or less into the empty space of receptacle 241 to press or push specimen table 244. Ball 250 may also be made of a non-magnetic material such as ceramic material, non-ferrous metals such as aluminum, copper, lead, nickel, tin, titanium and zinc, and non-ferrous alloys such as Beryllium Copper (BeCu). Any three protrusions of the four protrusions (242a, 242b, 242c and 251) are not in a linear relationship. As will be described in more details, the elastic protrusion 251 can push/press the specimen table 244 against all the three permanent protrusions 242a, 242b and 242c after the specimen table 244 is placed in the receptacle 241, so that the orientation and the position of the specimen table 244 relative to the specimen stage 240 is fixed. By 'fixed", it intends to mean that a disturbing vibration between 240 and 244 is ignored. As will be described later, in the presence of such vibration, the orientation and the position of the specimen table 244 is not absolutely fixed relative to the specimen stage 240.

Figure 10:
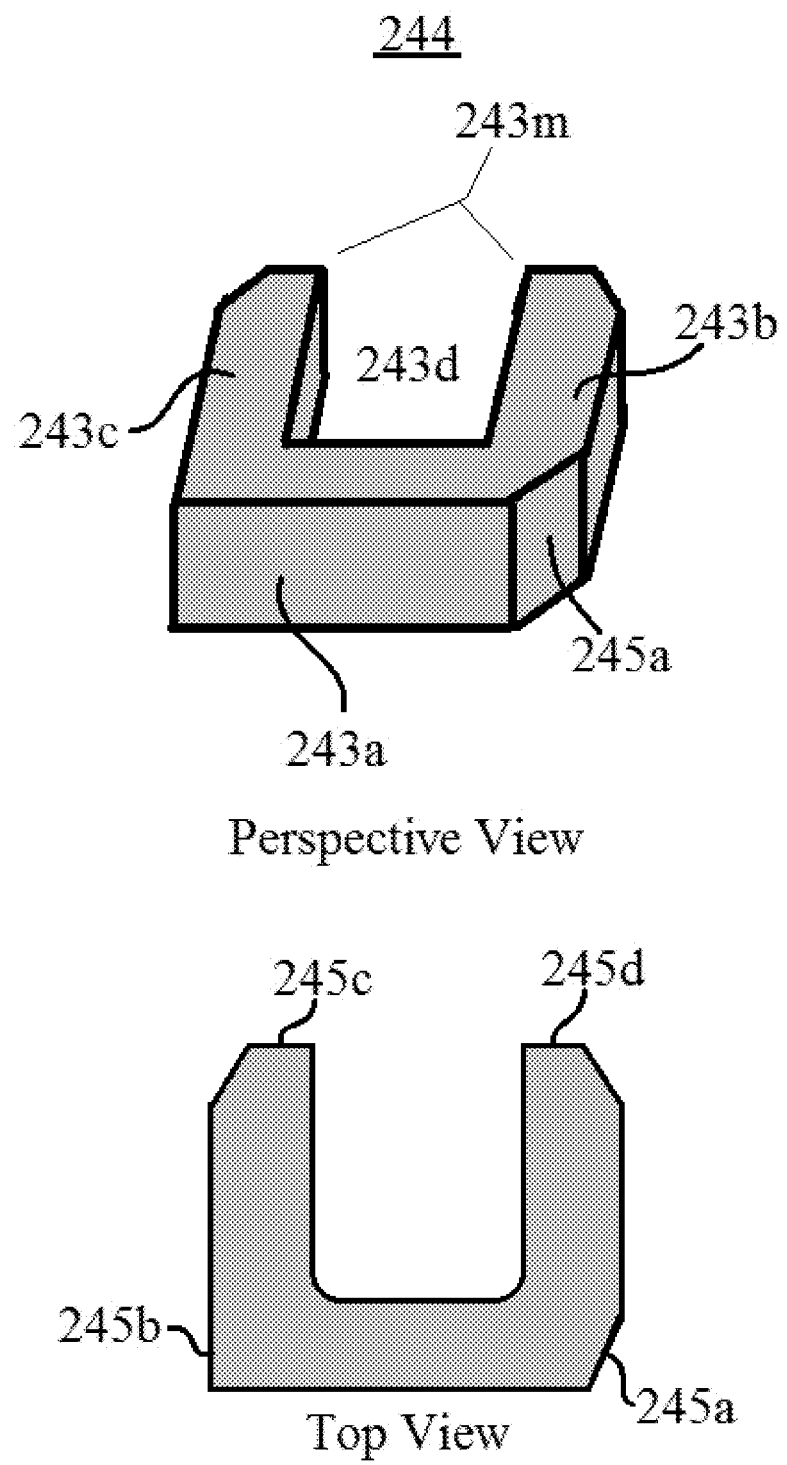
FIG. 10 demonstrates the perceptive view and top view of a specimen table in accordance with an exemplary embodiment of the present invention.

Referring to FIG. 10, the specimen table 244 may be U-shaped, and may include a base 243a, a right arm 243b and a left arm 243c that are extended from the base 243a. An open space 243d is thus formed by the base 243a and the two arms 243b and 243c. The open space 243d has a mouth 243m. An electron beam can pass through specimen 248, and then pass through the open space 243d in a transmission electron microscope. The specimen table 244 may include four side zones (245a, 245b, 245c and 245d) for contacting the four protrusions (242a, 242b, 242c and 251) in specimen stage 240. At least two of the side zones (245a, 245b, 245c and 245d) are flat or planar to prevent rotation of the specimen table 244 inside receptacle 241. For example, two, three or all of the side zones are flat. Any three of the four side zones are not parallel to each other, to prevent drifting of the specimen table 244 inside receptacle 241. Two side zones within a same plane are viewed as a special case of "parallel relationship". For example, zones 245c and 245d may be within the same plane and they are viewed as "parallel to each other". Zone 245b is perpendicular to zones 245c and 245d. Side zone 245a is not in parallel with, or perpendicular to, any other side zone (245b, 245c or 245d).

In some embodiments, one end or both ends of right arm 243b and left arm 243c that are distal from the base 243a may be tapered for facilitating the entry of the specimen table 244 into the receptacle 241. For example, the elastic protrusion 251 and front permanent protrusion 242a can function as a flexible gate structure to admit the specimen table 244 into the receptacle 241. The specimen table 244 can thus be "snapped into", and temporarily locked in, the receptacle 241. The end of the base 243a that is distal from the arms 243b and 243c may also be tapered for facilitating the retreat of the specimen table 244 from the receptacle 241. Side zone 245a may also function as the tapered end for facilitating the retreat of the specimen table 244.

Figure 11:
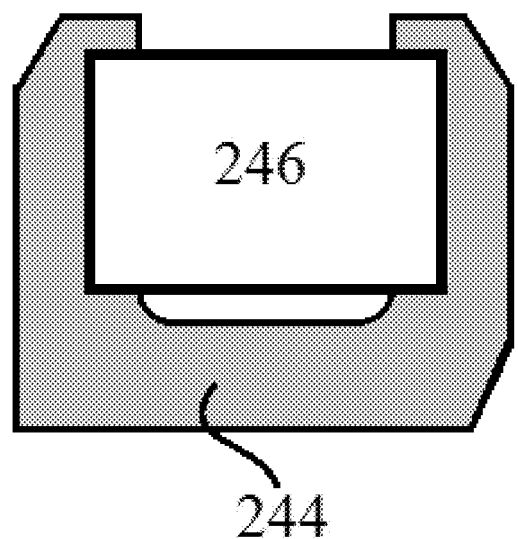
FIG. 11 depicts a piece of specimen, and its holder are placed over a specimen table in accordance with an exemplary embodiment of the present invention.
Figure 11:
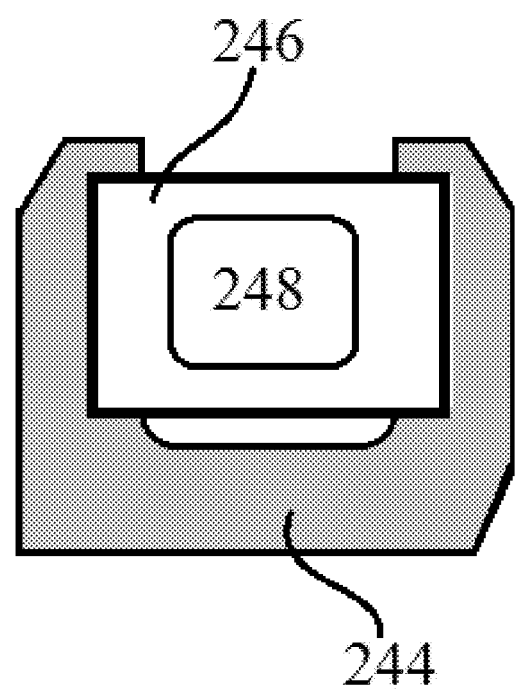

Referring to FIG. 11, a specimen holder 246 can be placed on the specimen table 244 and spanned over open space 243d. A specimen or a sample 248 can be placed on specimen holder 246 for microscope examination. Since specimen holder 246 and specimen 248 are stationary relative to specimen table 244, they will be stationary relative to the objective lens 224 during the period of examination time as well.

Figure 12:
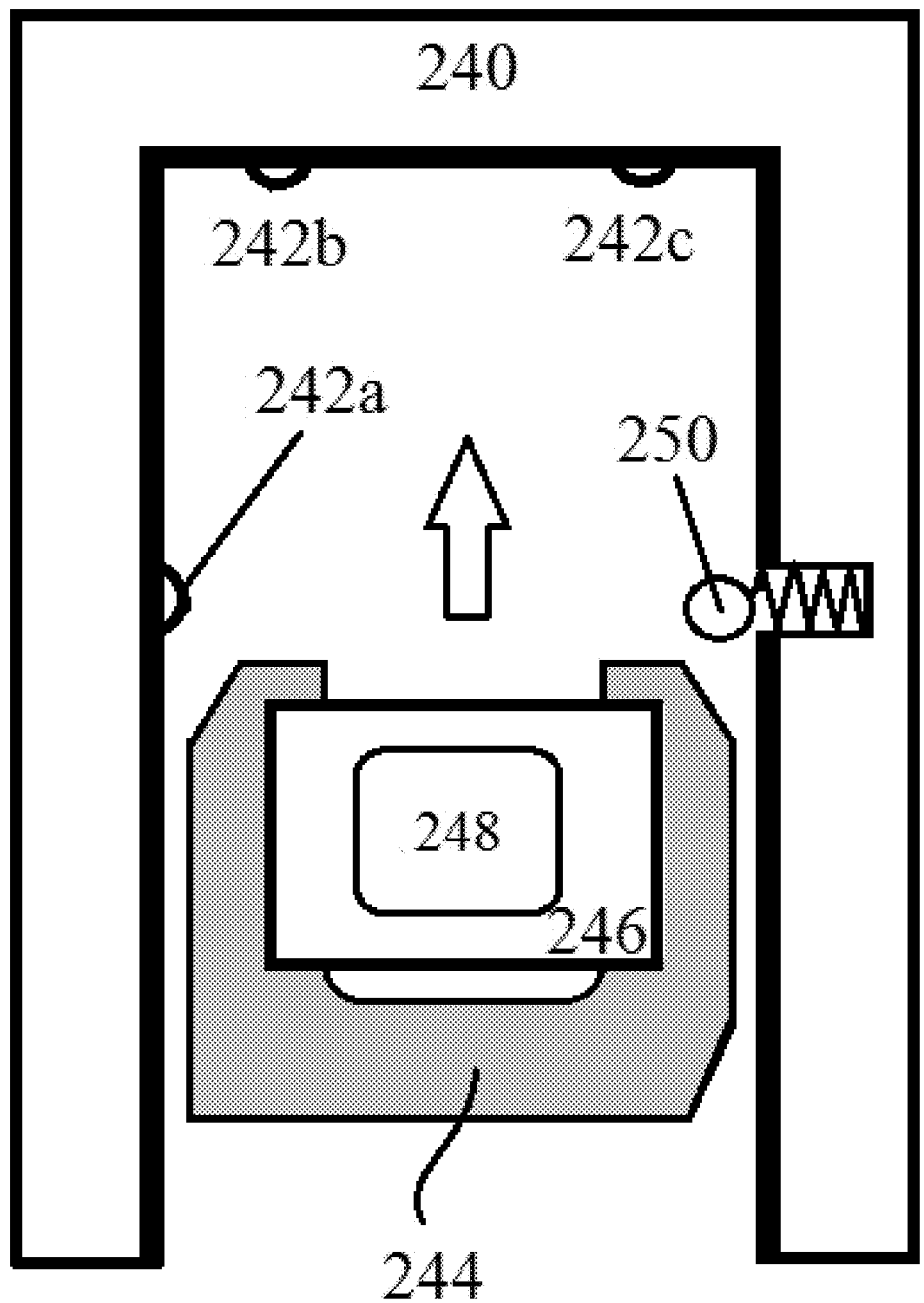
FIG. 12 schematically shows that a specimen table is to enter the receptacle of a specimen stage in accordance with an exemplary embodiment of the present invention.
Figure 13:
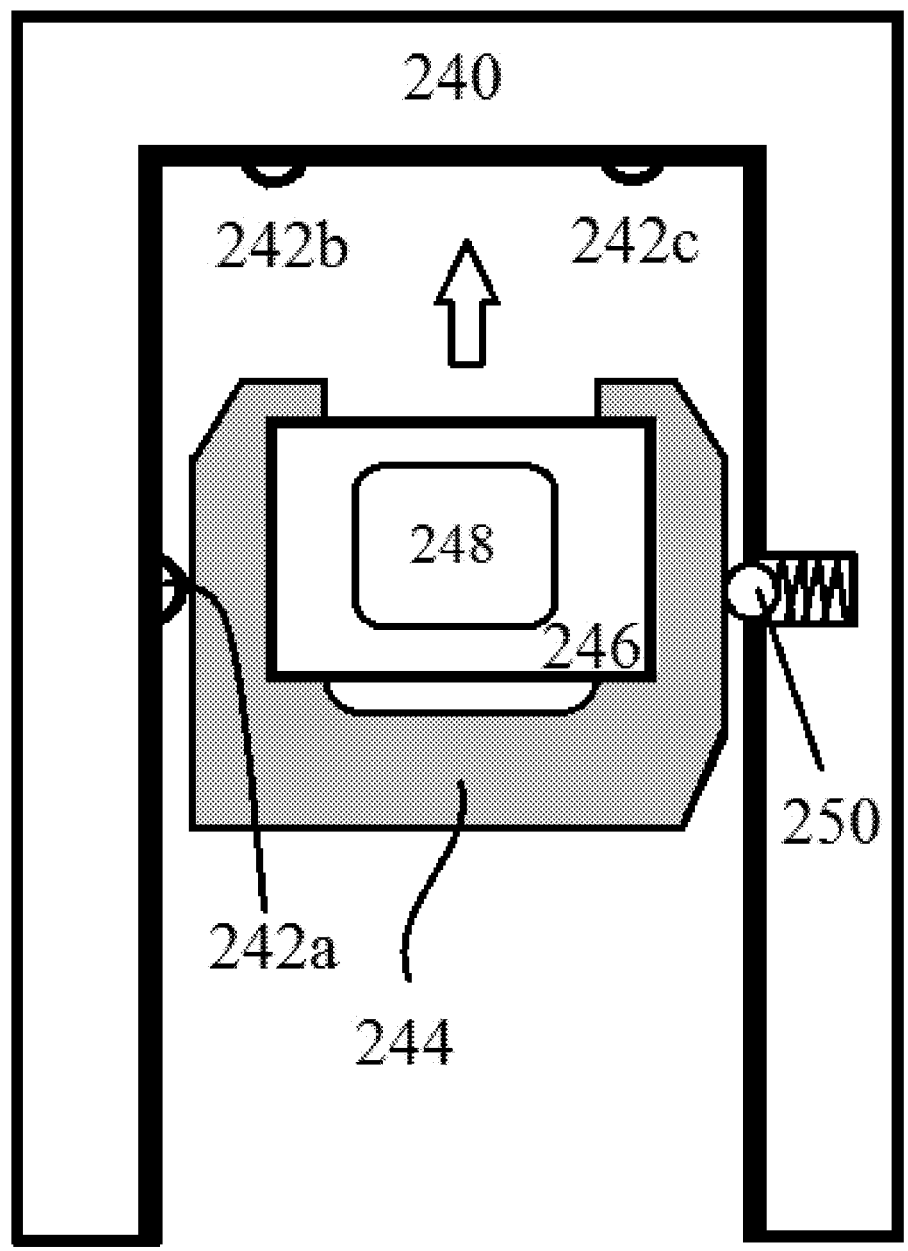
FIG. 13 schematically shows that a specimen table is entering the receptacle of a specimen stage in accordance with an exemplary embodiment of the present invention.
Figure 14:
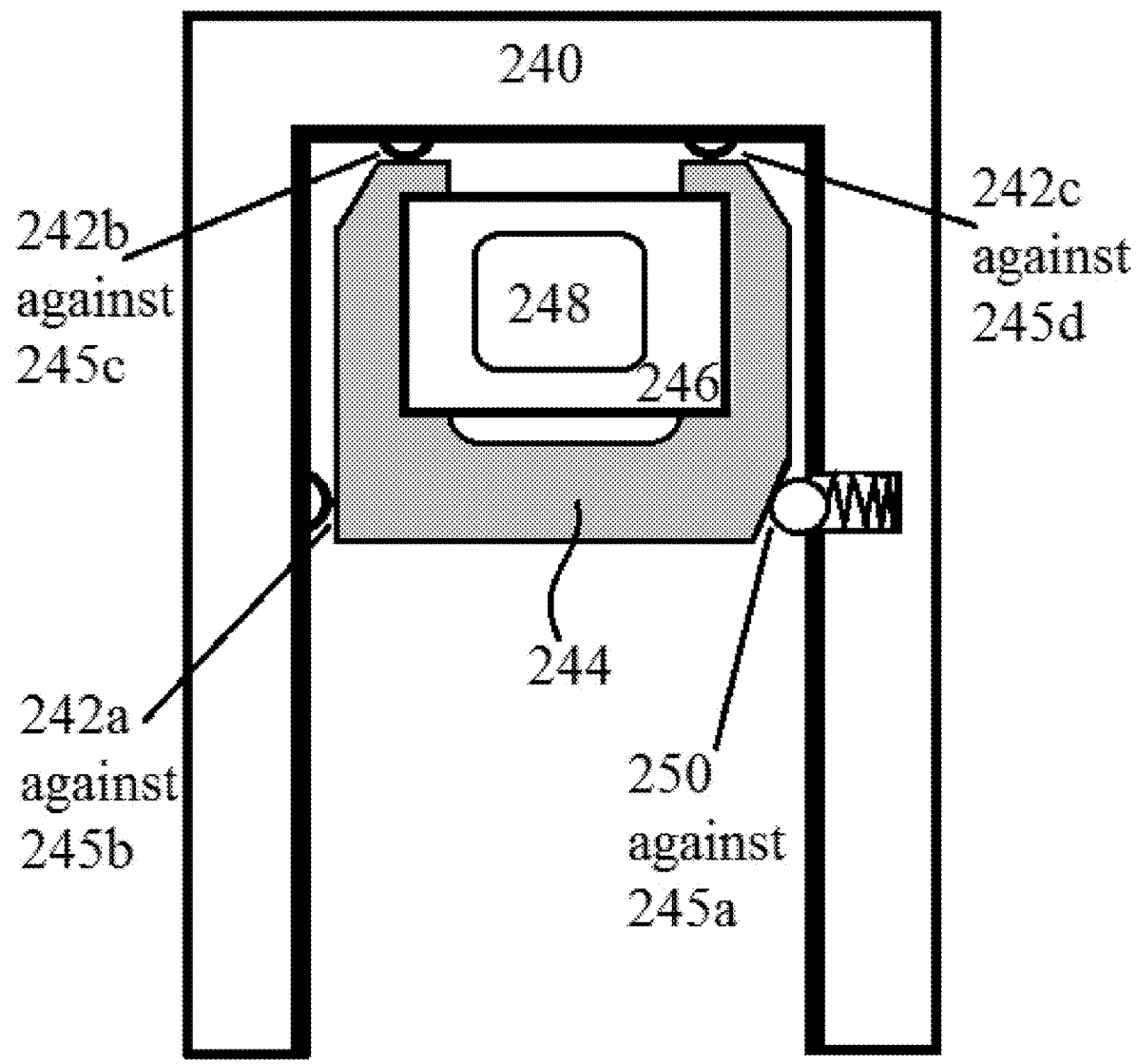
FIG. 14 shows that a specimen table has entered the receptacle of a specimen stage in accordance with an exemplary embodiment of the present invention.

Referring to FIGS. 12, 13 and 14, after specimen table 244 is loaded with specimen holder 246 and specimen 248, it can be gradually pushed into the receptacle 241 of a specimen stage 240.

Figure 15:
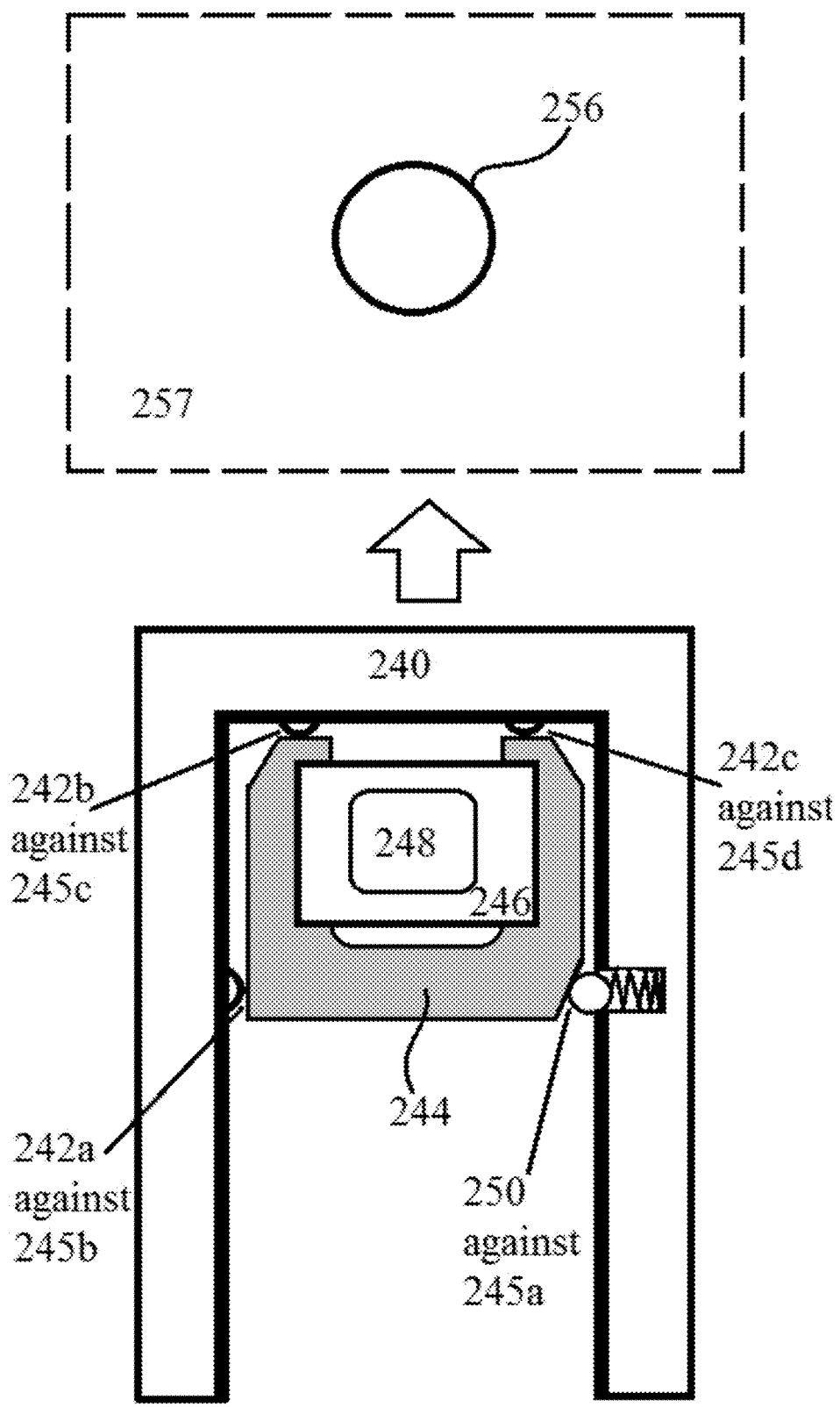
FIG. 15 illustrates that a specimen table is moved to a horizontal planar surface around the lower pole piece of the objective lens in accordance with an exemplary embodiment of the present invention.

Referring to FIGS. 15 and 7, the objective lens 224 has a horizontal planar surface 257 around lower pole piece 256 for the specimen table 244 to sit on and slide on. Specimen stage 240, loaded with specimen table 244, specimen holder 246 and specimen 248, can be gradually pushed onto horizontal planar surface 257. The open space 243d has a mouth 243m, and lower pole piece 256 can enter open space 243d through mouth 243m. Therefore, lower pole piece 256 does not hinder the movement of specimen table 244.

Figure 16:
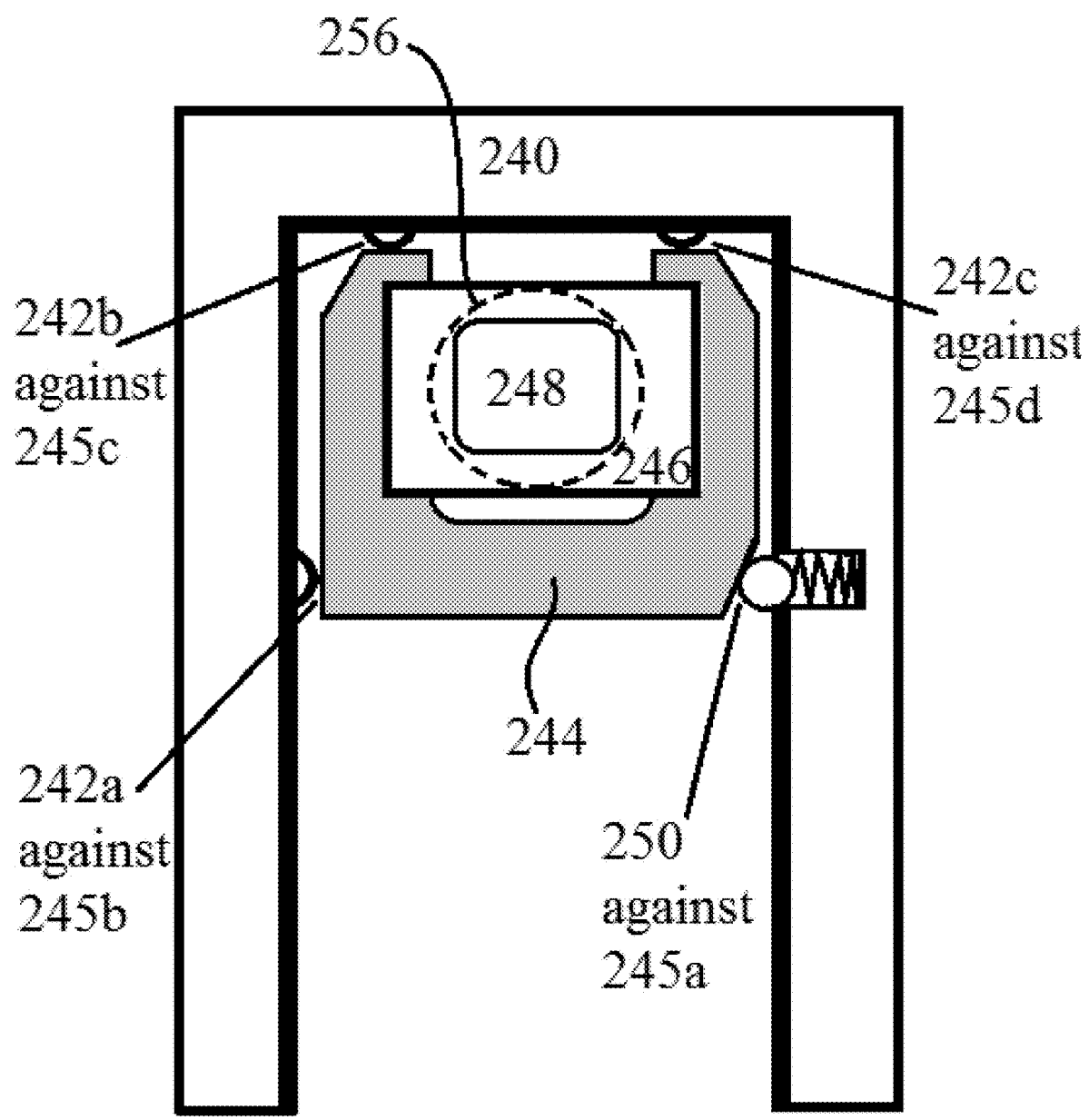
FIG. 16 demonstrates that the specimen is placed over the lower pole in accordance with an exemplary embodiment of the present invention.

Referring to FIG. 16, the specimen 248 is placed over, and aligned with, the lower pole piece 256, ready for microscopic measurement. Referring back to FIG. 7, a beam of electrons is transmitted through an ultra-thin specimen 248, interacting with the specimen as it passes through it. An image is formed from the interaction of the electrons transmitted through the specimen. The image is magnified and focused onto an imaging device, such as a fluorescent screen, on a layer of photographic film, or to be detected by a sensor such as a charge-coupled device.

Figure 17:
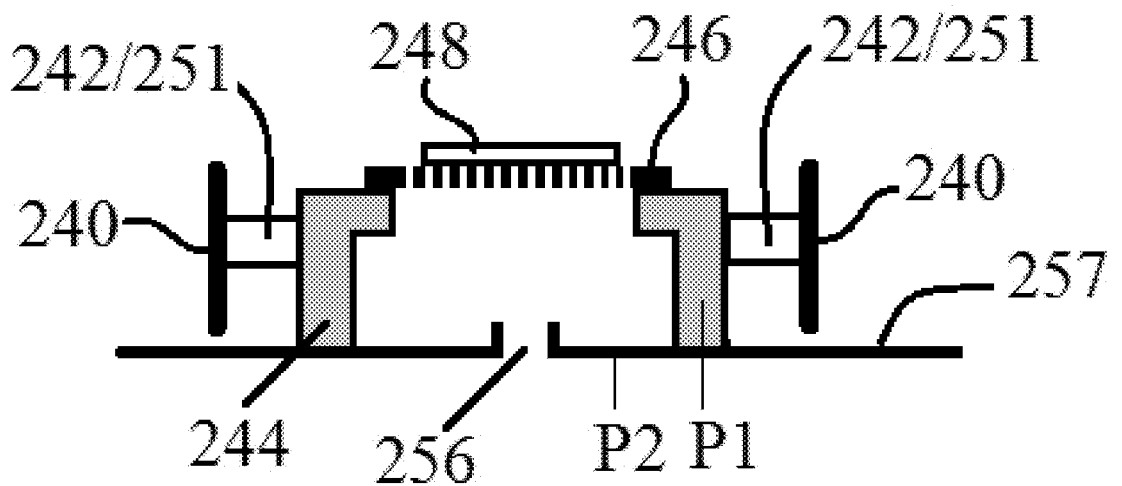
FIG. 17 depicts that, at a first predetermined position, a vibrating specimen stage cannot overcome the static friction between the specimen table and a planar surface of the objective lens, and therefore the specimen table remains stationary to the objective lens, in accordance with an exemplary embodiment of the present invention.
Figure 17:
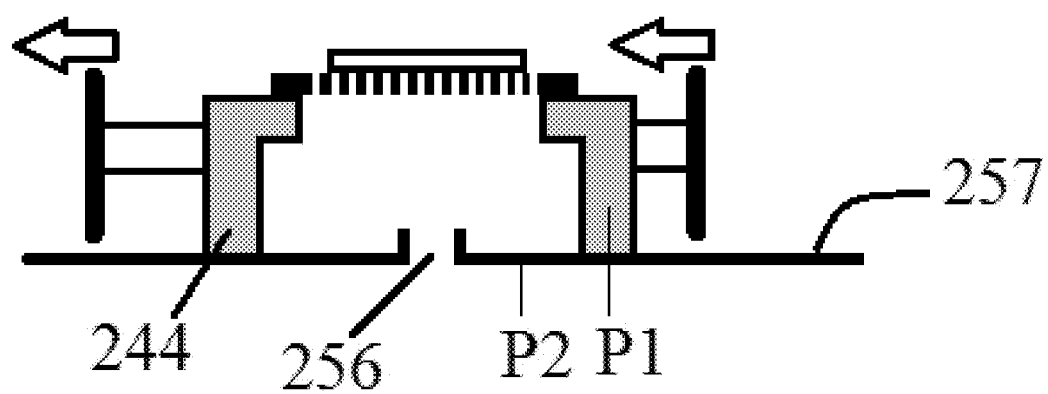
Figure 17:
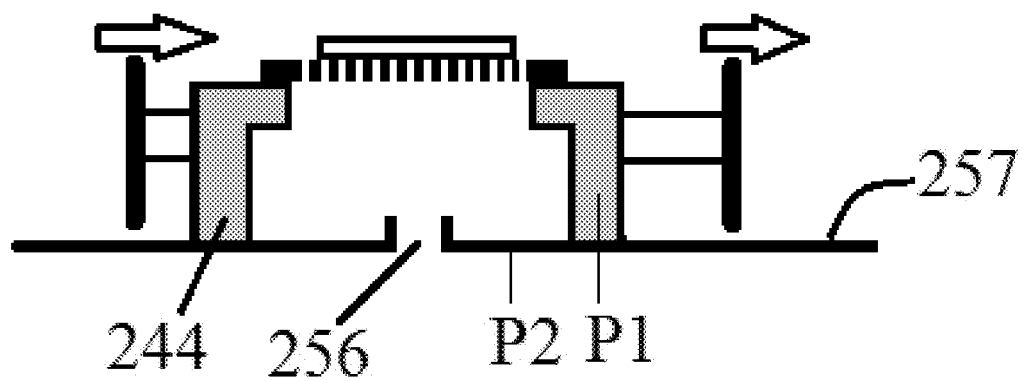

Referring to FIG. 17, when a disturbing vibration (represented by the arrows) between the objective lens 224 and the specimen stage 244 occurs during the period of microscopic examination time, at least some of the four protrusions (242a, 242b, 242c and 251) will absorb or dampen the vibration to an effect that the specimen table 244 remains stationary relative to the objective lens 224 during the period of examination time. In other words, an ensuing vibration is not generated between the objective lens 224 and the specimen table 244 on each of the predetermined positions during said period of examination time. The disturbing vibration may be a mechanical oscillation that occurs about one of the predetermined positions P1 as the equilibrium point. The vibration may be caused by the specimen stage 240 that vibrates relative to a stationary objective lens 224, or caused by the objective lens 224 that vibrates relative to a stationary specimen stage 240. The vibration may be caused by a vibrating specimen stage 240 and an objective lens 224, but the two vibrations have different amplitudes and/or different phases.

When the specimen stage 240 vibrates relative to the objective lens 224, one or more of the four protrusions will be deformed or compressed, and an elastic force of equal magnitude and opposite direction is generated from the deformation or compression of the protrusions. The force is applied to the specimen table 244. However, the vibration has a small amplitude of less than 2 nm, such as less than 1 nm, and the deformation or compression of the protrusions is also in the same magnitude. As a result, the generated force is not strong enough to overcome the static friction between the specimen table 244 and the planar surface 257 of the objective lens 224. The disturbing vibration of the stage 240 cannot transmit to the specimen table 244. In other words, the specimen stage 240 cannot overcome the static friction between the specimen table 244 on the predetermined position P1 and the planar surface 257 of the objective lens 224, so that an ensuing vibration between the objective lens 224 and the specimen table 244 cannot be generated. The specimen table 244 on the predetermined position P1 remains stationary relative to the objective lens 224.

Figure 18:
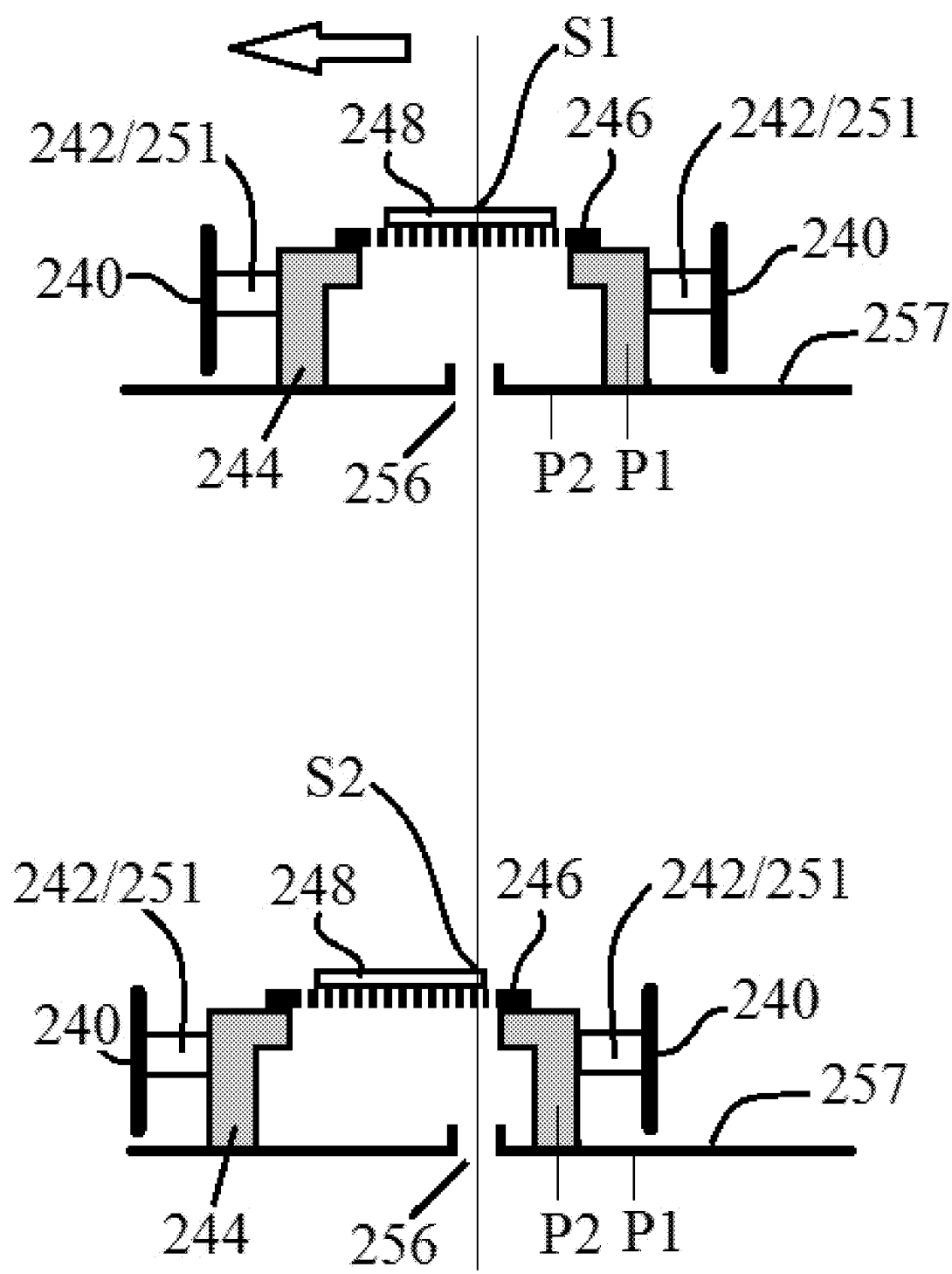
FIG. 18 schematically shows that a moving specimen stage can overcome the static friction between the specimen table and a planar surface of the objective lens, and it can therefore move the specimen table from the first predetermined position to a second predetermined position, in accordance with an exemplary embodiment of the present invention.

After the measurement on positon P1 is completed, the specimen table 244 can slide on the planar surface 257 from position P1 to another predetermined position P2. A predetermined position may be corresponding to an observation point S of the specimen. As shown in FIG. 18, the predetermined positions P1 and P2 on the planar surface 257 of the objective lens 224 are corresponding to observation point S1 and S2 of the specimen 248, respectively. Since the sliding distance between P1 and P2 (or S1 and S2) is greater than 1 μm, which is more than 1000 times longer than the disturbing vibration amplitude (<1 nm level), the elastic force generated from the deformation or compression of the protrusions will be much greater than the static friction force between the specimen table 244 and the planar surface 257. The specimen stage 240 can overcome the static (let alone kinetic) friction between the specimen table 244 and the planar surface 257 of the objective lens 224. As a result, the specimen stage 240 forces the specimen table 244 to slide on the planar surface 257 from a predetermined position P1 to another P2.

Figure 19:
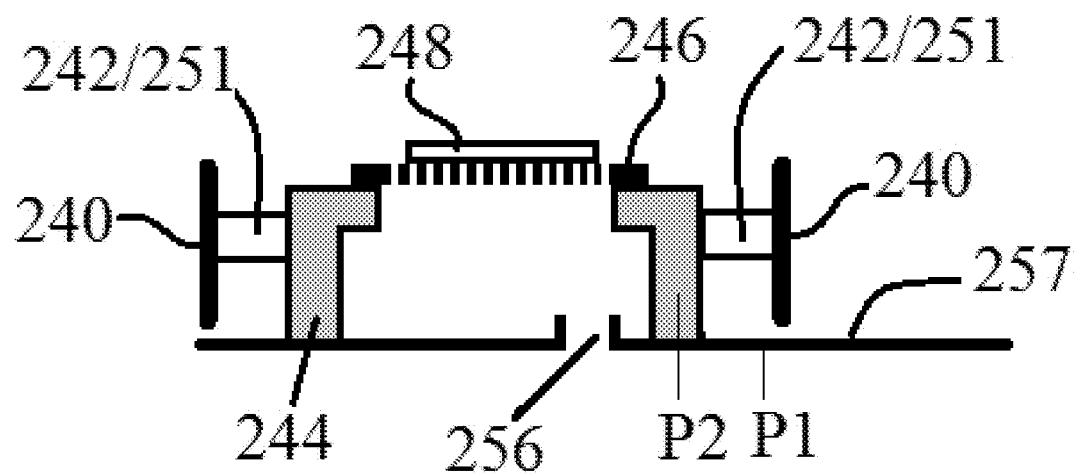
FIG. 19 illustrates that, at the second predetermined position, a vibrating specimen stage cannot overcome the static friction between the specimen table and a planar surface of the objective lens, and therefore the specimen table remains stationary to the objective lens, in accordance with an exemplary embodiment of the present invention.
Figure 19:
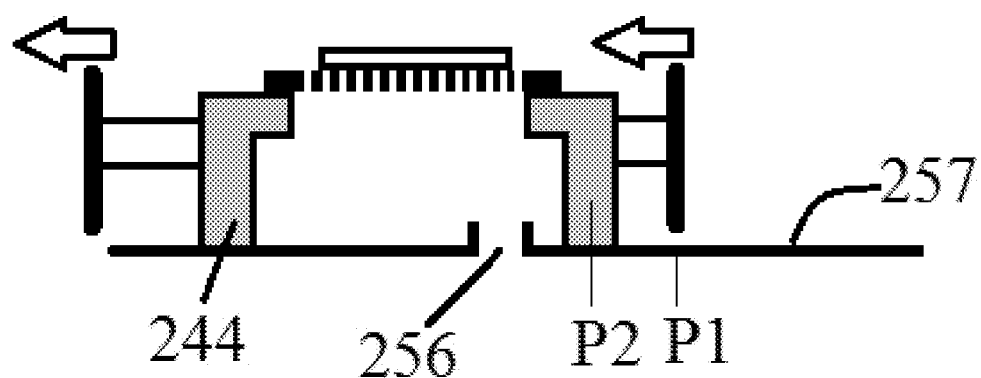
Figure 19:
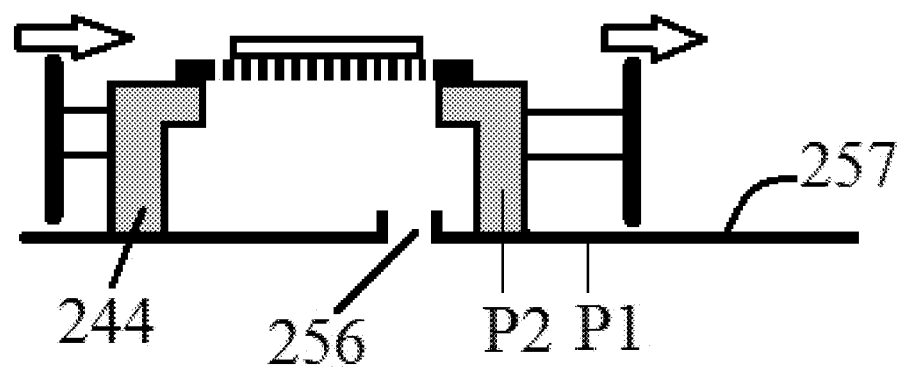

Like FIG. 17, FIG. 19 shows that the vibration occurs about a new predetermined positions P2 as the equilibrium point. Again, the specimen stage 240 cannot overcome the static friction between the specimen table 244 on the predetermined position P2 and the planar surface 257 of the objective lens 224, so that an ensuing vibration between the objective lens 224 and the specimen table 244 cannot be generated. The specimen table 244 on the predetermined position P2 remains stationary relative to the objective lens 224, until it is forced to slide to another predetermined point.

The aforementioned "static friction" is defined as friction between two solid objects that are not moving relative to each other. For example, static friction can prevent an object from sliding down a sloped surface. The static friction force must be overcome by an applied force before an object can move. The maximum value of static friction, when motion is impending, is referred to as limiting friction. In the present invention, disturbing vibration and drift generates a force that is lower than the limiting friction between the specimen table 244 and the planar surface 257 of the objective lens 224.

When sliding occurs, static friction is no longer applicable, the friction between the two surfaces is then called kinetic friction, dynamic friction or sliding friction. Kinetic friction occurs when two objects are moving relative to each other and rub together (like a sled on the ground). The coefficient of static friction is generally higher than the coefficient of kinetic friction.

According to the present invention, the limiting friction between the specimen table 244 and the planar surface 257 of the objective lens 224 can be adjusted and made suitable for any apparatus of charged-particle beam such as an electron microscope. The following variable factors can be used for the purpose of tuning the limiting friction: the weight of specimen table 244, the size of specimen table 244's bottom surface that contacts planar surface 257, the surface properties of specimen table 244's bottom surface, and the surface properties of planar surface 257, among others.

Figure 20:
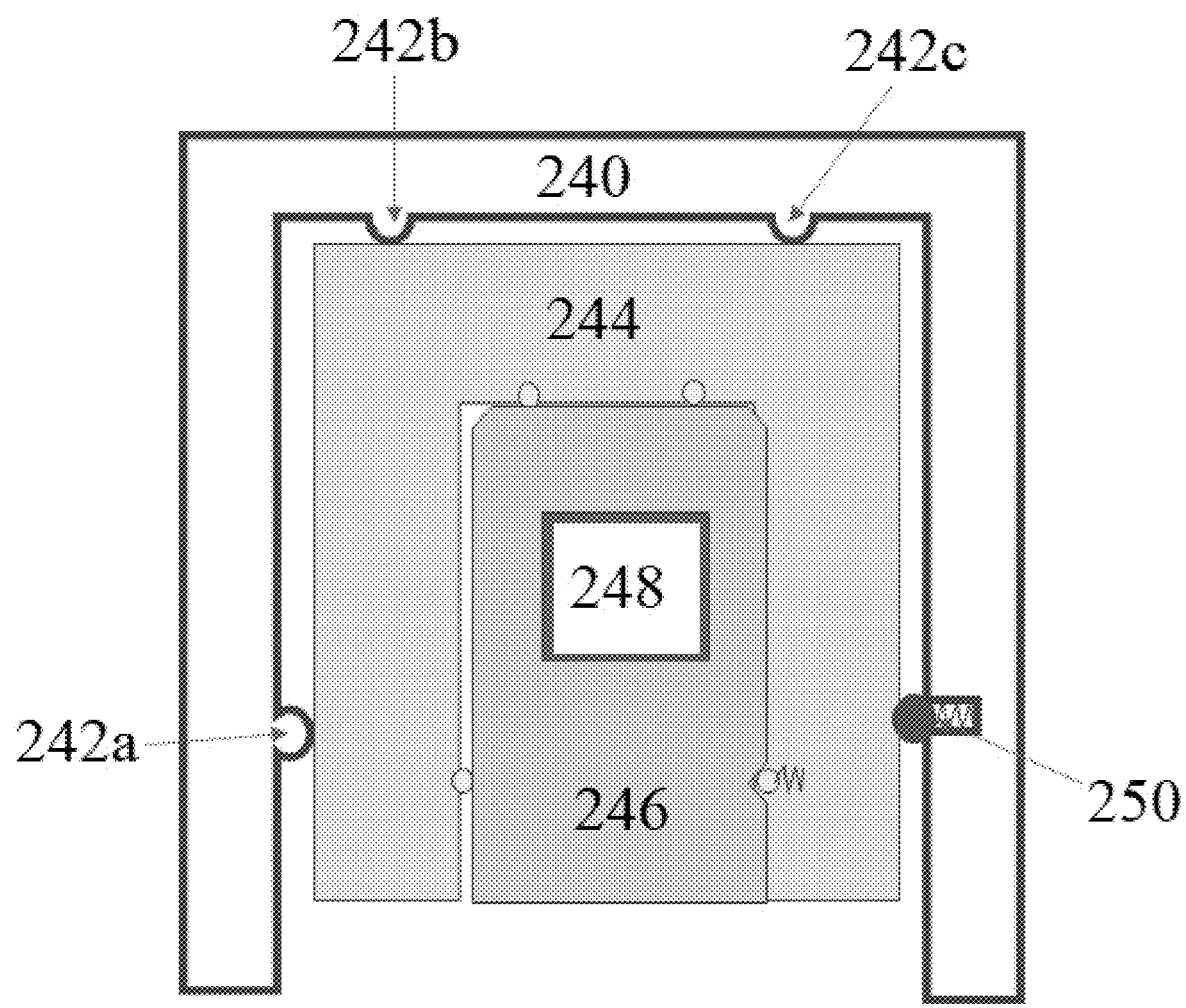
FIG. 20 schematically shows a different design of sliding specimen table and specimen holder in accordance with an exemplary embodiment of the present invention.

In some other embodiments of the invention as shown in FIG. 20, sliding specimen table 244 and specimen holder 246 may have a design that is different from those described above. Like FIG. 10, specimen table 244 in FIG. 20 may also be U-shaped, and may also include a base 243a, a right arm 243b and a left arm 243c that are extended from the base 243a. An open space 243d is thus formed by the base 243a and the two arms 243b and 243c. The open space 243d has a mouth 243m.

However, unlike FIG. 10, it is the base 243a (rather than mouth 243m) that will contact permanent protrusions 242b and 242c. Side zone 245a is thus optional in FIG. 20. When side zone 245a is not present, left arm 243c itself will directly contact ball 250. Moreover, one or both of the ends of right arm 243b and left arm 243c that are distal from the base 243a may be flat, and may not necessarily be tapered, since they are not needed for facilitating the entry of the specimen table 244 into the receptacle 241. Instead, base 243a can be tapered for facilitating the entry of the specimen table 244 into the receptacle 241.

Unlike in FIG. 11, specimen holder 246 in FIG. 20 is not placed on or above the specimen table 244 and is therefore not spanned over open space 243d. Instead, specimen holder 246 in FIG. 20 will be inserted into open space 243d. Like FIG. 11, a specimen or a sample 248 can be placed on specimen holder 246 for microscope examination.

As an alternative to, or in addition to, three permanent protrusions 242a, 242b and 242c, and one elastic protrusion 251 including ball 250 attached to spring 252 as described and illustrated above, specimen table 244 may have three same or similar permanent protrusions and one elastic protrusion same or similar around specimen holder 246.

Referring back to FIGS. 2, 3 and 7-20, in a specific embodiment, X-Y stage 240 is moved by two spring leaf's and the X-Y moving is un-orthogonal moving. X Y stage is in the same level and combined moving, not like traditional X Y stage that is moved separately and overlay together. The stage moving range is small and orthogonal X Y position will need to be calibrated.

In the foregoing specification, embodiments of the present invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicant to be the scope of the invention, is the literal and equivalent scope of the set of claims that issue from this application, in the specific form in which such claims issue, including any subsequent correction.

The invention claimed is:

1. A driving system comprising:
 a first actuator configured to move a first shaft;
 a second actuator configured to move a second shaft;
 a stage;
 a first elastic connector connecting the first shaft and the stage; and
 a second elastic connector connecting the second shaft and the stage;
 wherein the stage is moved around on a plane such as a horizontal plane by combined elastic forces from the two elastic connectors that are deformed by the one or two actuators; and
 wherein each of the two elastic connectors includes two or more spring leaves such as two copper spring leaves; or a block of elastic material such as polybutadiene, butyl rubber, and silicon rubber.

2. The driving system according to claim 1, wherein the first actuator and the second actuator are identical; the first shaft and the second shaft are identical; and the first elastic connector and the second elastic connector are identical.

3. The driving system according to claim 1, wherein the first actuator is configured to move the first shaft along a longitudinal direction thereof ("the first longitudinal direction");
 wherein the second actuator is configured to move the second shaft along a longitudinal direction thereof ("the second longitudinal direction"); and
 wherein the first longitudinal direction and the second longitudinal direction have an angle of greater than 0° and less than 180° such as 85-95°.

4. The driving system according to claim 1, wherein the first longitudinal direction and the second longitudinal direction have an angle of about 90°.

5. The driving system according to claim 1, which is placed inside a vacuum environment or an atmospheric environment.

6. The driving system according to claim 1, wherein the stage is configured to carry a control device, a sample (or specimen) or a workpiece; or wherein at least a part of the stage itself is a control device, a sample (or specimen) or a workpiece.

7. The driving system according to claim 1, wherein the first and second actuators are two motors such as linear motors, step motors, magnetic levitations, planar motors, piezoelectric motors, pulse motors, or any combination thereof.

8. An apparatus/device comprising a driving system according to claim 1, such as a machine tool, an analytical instrument, an optical microscope, and an apparatus of charged-particle beam such as electron microscope and an electron beam lithographical apparatus.

9. A driving system comprising:
 a first actuator configured to move a first shaft;
 a second actuator configured to move a second shaft;
 a stage;

a first elastic connector connecting the first shaft and the stage; and a second elastic connector connecting the second shaft and the stage;

wherein the stage is configured to carry a control device, and wherein the control device is an electron beam control device such as a (metal) plate with two or more apertures of different sizes, such as a matrix of apertures.

10. An apparatus of charged-particle beam such as an electron microscope that includes a driving system, an object lens, and a specimen table, wherein the driving system comprises:

a first actuator configured to move a first shaft;

a second actuator configured to move a second shaft;

a stage;

a first elastic connector connecting the first shaft and the stage; and a second elastic connector connecting the second shaft and the stagedriving system;

wherein the stage functions as a specimen stage and has an empty space as a receptacle for accommodating the specimen table;

wherein the objective lens has a planar surface configured for the specimen table to sit on and slide on;

wherein the specimen table can be placed into, and removed away, from the receptacle;

wherein the specimen stage comprises an elastic protrusion and one or more elastic force receiving parts surrounding the receptacle such as a side wall opposite to the elastic protrusion, a side wall neighboring the elastic protrusion, and/or protrusion(s) on the side wall opposite to the elastic protrusion and/or the side wall neighboring the elastic protrusion;

wherein the elastic protrusion is configured to push or press the specimen table against said one or more elastic force receiving parts of the specimen stage after the specimen table is placed into the receptacle, so that the orientation and the position of the specimen table is fixed relative to the specimen stage;

wherein the specimen stage can move the specimen table by sliding it to a plurality of predetermined positions on said planar surface of the objective lens, and to hold the specimen table on each of the predetermined positions for a period of examination time; and wherein, when a disturbing vibration between the objective lens and the specimen stage occurs during said period of examination time, the elastic protrusion will absorb the disturbing vibration to an effect that the specimen table remains stationary relative to the objective lens.

11. The apparatus of charged-particle beam according to claim 10, wherein said one or more elastic force receiving parts of the specimen stage comprise three permanent protrusions on the side wall opposite to the elastic protrusion and/or the side wall neighboring the elastic protrusion, wherein the three permanent protrusions and the elastic protrusion surround the receptacle, and any three protrusions of said four protrusions are not arranged in a linear relationship;

wherein the elastic protrusion is configured to push or press the specimen table against the three permanent protrusions after the specimen table is placed in the receptacle, so that the orientation and the position of the specimen table is fixed relative to the specimen stage.

12. The apparatus of charged-particle beam according to claim 11, further comprising a specimen holder on said specimen table, on which a specimen can be placed for microscope examination.

13. The apparatus of charged-particle beam according to claim 11, wherein the planar surface is a top surface of the lower pole piece of the objective lens.

14. The apparatus of charged-particle beam according to claim 11, wherein the specimen table is U-shaped, and includes a base, a right arm and a left arm that are extended from the base, and an open space formed by the base and the two arms.

15. The apparatus of charged-particle beam according to claim 14, wherein the specimen table incudes four side zones for contacting the four protrusions, and at least two of the side zones are flat or planar.

16. The apparatus of charged-particle beam according to claim 15, wherein one or both of the ends of the right arm and the left arm that are distal from the base are tapered for facilitating the entry of the specimen table into the receptacle.

17. The apparatus of charged-particle beam according to claim 16, wherein the end of the base that is distal from the arms is tapered for facilitating the retreat of the specimen table from the receptacle.

18. The apparatus of charged-particle beam according to claim 17, wherein all the four side zones are flat or planar, and any three of the four side zones are not parallel to each other.

* * * * *